(12) United States Patent
Harada et al.

(10) Patent No.: US 12,062,378 B2
(45) Date of Patent: Aug. 13, 2024

(54) ENCODING DEVICE, DECODING DEVICE, ENCODING METHOD, AND DECODING METHOD

(71) Applicant: Panasonic Intellectual Property Corporation of America, Torrance, CA (US)

(72) Inventors: Akira Harada, Kanagawa (JP); Hiroyuki Ehara, Kanagawa (JP); Toshiaki Sakurai, Kanagawa (JP)

(73) Assignee: PANASONIC INTELLECTUAL PROPERTY CORPORATION OF AMERICA, Torrance, CA (US)

( * ) Notice: Subject to any disclaimer, the term of this patent is extended or adjusted under 35 U.S.C. 154(b) by 186 days.

(21) Appl. No.: 17/791,708

(22) PCT Filed: Dec. 2, 2020

(86) PCT No.: PCT/JP2020/044887
§ 371 (c)(1),
(2) Date: Jul. 8, 2022

(87) PCT Pub. No.: WO2021/140791
PCT Pub. Date: Jul. 15, 2021

(65) Prior Publication Data
US 2023/0023321 A1 Jan. 26, 2023

(30) Foreign Application Priority Data
Jan. 9, 2020 (JP) .................................. 2020-001961

(51) Int. Cl.
*G10L 19/008* (2013.01)
(52) U.S. Cl.
CPC ................................ *G10L 19/008* (2013.01)

(58) Field of Classification Search
CPC ........ H03M 7/30; H03M 7/40; H03M 7/4006; H03M 5/145; H03M 1/66; H03M 13/23; H03M 7/14; H03M 1/00; G10L 19/008
See application file for complete search history.

(56) References Cited

U.S. PATENT DOCUMENTS

2003/0043281 A1* 3/2003 Nakamura ........... H04N 23/661
348/E5.025
2004/0071218 A1* 4/2004 Seo ................ H04N 21/440218
375/E7.271
(Continued)

FOREIGN PATENT DOCUMENTS

JP 2014-516425 A 7/2014
JP 6092187 B2 3/2017
(Continued)

OTHER PUBLICATIONS

International Search Report (including English Language Translation), mailed Feb. 22, 2021, by the Japan Patent Office (JPO), in International Application No. PCT/JP2020/044887.

*Primary Examiner* — Akelaw Teshale
(74) *Attorney, Agent, or Firm* — Greenblum & Bernstein, P.L.C.

(57) ABSTRACT

This encoding device is provided with a control circuit that, on the basis of information relating to the capability to convert the signal form of a sound signal in a decoding device for decoding encoded data of the sound signal, controls the conversion of the signal form of the sound signal, and an encoding circuit that encodes the sound signal in accordance to the conversion control.

12 Claims, 16 Drawing Sheets

(56) References Cited

U.S. PATENT DOCUMENTS

| | | | | |
|---|---|---|---|---|
| 2006/0147185 A1* | 7/2006 | Erickson | ............ | H04N 21/4398 |
| | | | | 386/E9.017 |
| 2006/0171689 A1* | 8/2006 | Smith | .................. | H04N 9/8045 |
| | | | | 386/E9.017 |
| 2012/0275604 A1 | 11/2012 | Vos | | |
| 2016/0241981 A1* | 8/2016 | Law | ...................... | G10L 19/008 |
| 2017/0214968 A1* | 7/2017 | Braithwaite | .......... | H04L 65/611 |
| 2018/0322884 A1 | 11/2018 | Bayer et al. | | |

FOREIGN PATENT DOCUMENTS

| | | |
|---|---|---|
| JP | 2019-502966 A | 1/2019 |
| WO | 01/76172 A2 | 10/2001 |
| WO | 2019/229300 A1 | 12/2019 |

\* cited by examiner

ENCODING DEVICE, DECODING DEVICE, ENCODING METHOD, AND DECODING METHOD

TECHNICAL FIELD

The present disclosure relates to an encoding apparatus, a decoding apparatus, an encoding method, and a decoding method.

BACKGROUND ART

Middle/Side (M/S) stereo encoding (see, for example, Patent Literature (hereinafter, referred to as PTL) 1) is one of techniques to encode input from a microphone, for example.

CITATION LIST

Patent Literature

PTL 1
Japanese Unexamined Patent Application Publication (Translation of PCT Application) No. 2014-516425
PTL 2
Japanese Unexamined Patent Application Publication (Translation of PCT Application) No. 2019-502966
PTL 3
WO 2019/229300
PTL 4
WO 2001/076172

SUMMARY OF INVENTION

There is scope for further study, however, on encoding and decoding methods in accordance with the type of a microphone (i.e., the signal format of a sound signal).

One non-limiting and exemplary embodiment facilitates providing an encoding apparatus, a decoding apparatus, an encoding method, and a decoding method each capable of encoding and decoding in accordance with the signal format of a sound signal.

An encoding apparatus according to an embodiment of the present disclosure includes: control circuitry, which, in operation, performs control for conversion of a signal format of a sound signal based on information on a conversion capability of a decoding apparatus that decodes encoded data of the sound signal, the conversion capability being a capability for converting the signal format of the sound signal; and encoding circuitry, which, in operation, encodes the sound signal following the control for the conversion.

It should be noted that general or specific embodiments may be implemented as a system, an apparatus, a method, an integrated circuit, a computer program, a storage medium, or any selective combination thereof.

An exemplary embodiment of the present disclosure enables encoding (or decoding) in accordance with the signal format of a sound signal.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DESCRIPTION OF EMBODIMENTS

Hereinafter, embodiments of the present disclosure will be described in detail with reference to the accompanying drawings.

An exemplary encoding method that has been proposed is a method of M/S stereo encoding for an input signal (e.g., audio signal or acoustic signal (also referred to as audio acoustic signal)) acquired by a stereo microphone (see, for example, PTLs 1 and 2). The M/S stereo encoding improves, for example, a compression performance of the signal.

The stereo microphone includes, for example, a Mid-Side (M-S) microphone that acquires an M signal (sum signal) and an S signal (difference signal), and a microphone that acquires an L channel signal and an R channel signal composing a stereo signal, such as an A-B microphone or an X-Y microphone. In the following, for example, a signal format of a stereo signal represented by the M signal and the S signal is referred to as an "M/S format", and a signal format of a stereo signal represented by the L channel signal and the R channel signal is referred to as an "L/R format".

Here, a stereo encoding method for an M/S format signal acquired by the M-S microphone, for example, will be discussed.

For example, when an M/S format signal is encoded in a communication terminal and the M and S signals are played in the L and R channels of headphones or a speaker at a counterpart device (i.e., receiver), which is a communication counterpart, a user may feel uncomfortable. In addition, an existing codec (e.g., Enhanced Voice Services: EVS), for example, assumes input of an UR format signal to the codec, and thus the input of the M/S format signal possibly impairs the encoding performance of the codec.

In one non-limiting and exemplary embodiment of the present disclosure, a description will be given of a method of appropriately encoding an M/S format signal acquired by an M-S microphone, which is an exemplary microphone.

Overview of Transmission System

Figure 1:
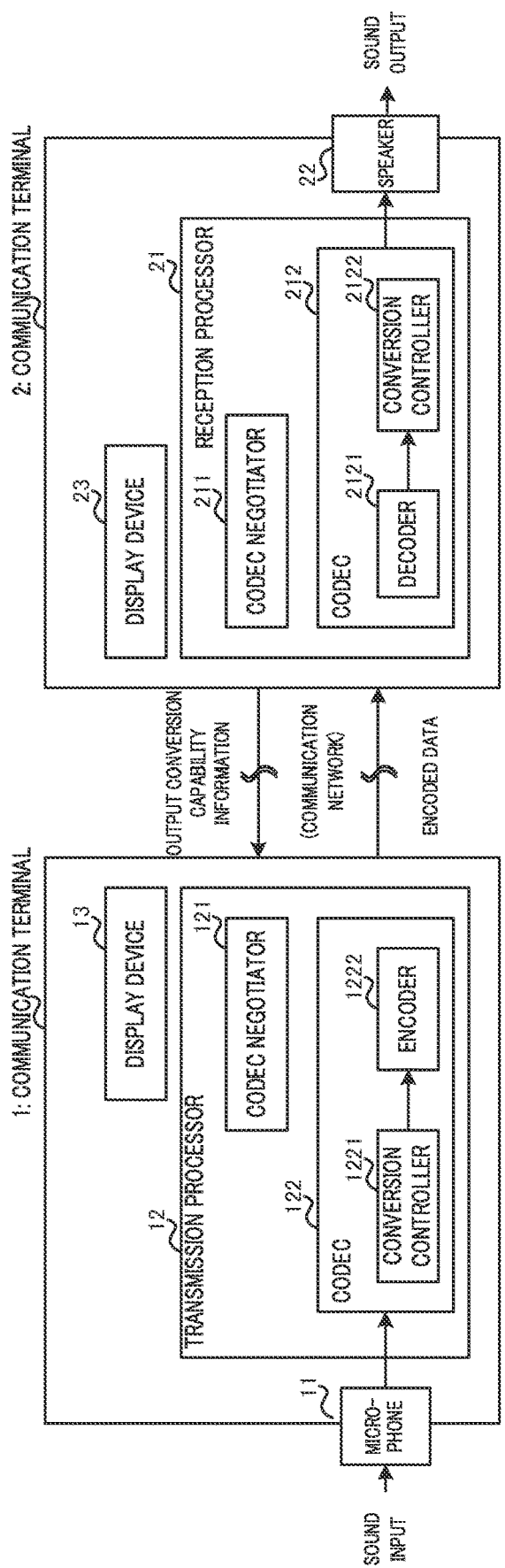
FIG. 1 is a block diagram illustrating an exemplary configuration of a transmission system according to Embodiment 1.

FIG. 1 illustrates an exemplary configuration of a transmission system for an audio acoustic signal according to the present embodiment.

The transmission system illustrated in FIG. 1 includes, for example, communication terminal 1 and communication terminal 2 at least.

Communication terminal 1 encodes, for example, an input signal such as an audio signal or an acoustic signal. The encoded data is transmitted or inputted to communication terminal 2. For example, the encoded data may be received by communication terminal 2 via a communication network, and the encoded data stored in a recording medium may be inputted to communication terminal 2. The "communication network" may be replaced by a wired or radio "transmission channel". In addition, communication terminal 1 may include, for example various audio acoustic codecs (e.g., codec 122 illustrated in FIG. 1) specified in the standard such as the Moving Picture Experts Group (MPEG), the 3rd Generation Partnership Project (3GPP), or the International Telecommunication Union Telecommunication Standardization Sector (ITU-T).

Communication terminal 2 decodes the encoded data received from communication terminal 1 via, for example, the transmission channel or recording medium, and outputs an output signal (e.g., electrical signal). Communication terminal 2 may output the electrical signal, for example, as a sound wave via a speaker or headphones. Additionally, communication terminal 2 may include, for example, reception processor 21 that corresponds to the audio acoustic codec described above.

Note that, in the following description, it is assumed that communication terminal 1 is an apparatus on the transmission side (e.g., also referred to as a transmitter) that transmits encoded data of an audio acoustic signal, and communication terminal 2 is an apparatus on the reception side (e.g., also referred to as a receiver) that receives encoded data of an audio acoustic signal, by way of example. With this regard, FIG. 1 illustrates an example where communication terminal 1 includes a functional unit for processing on the transmission side, and communication terminal 2 includes a functional unit for processing on the reception side. Note that the configurations of communication terminal 1 and communication terminal 2 are not limited to the examples illustrated in FIG. 1, and may include both of the functional units on the transmission side and the reception side. In other words, communication between communication terminal 1 and communication terminal 2 may be unidirectional or bidirectional.

[Exemplary Configuration of Communication Terminal 1]

Communication terminal 1 illustrated in FIG. 1 includes, for example, microphone 11, transmission processor 12 (corresponding to an encoding apparatus), and display device 13.

Microphone 11 is, for example, an input device for sound such as voice or acoustic sound, and outputs an acquired (i.e., collected or recorded) audio acoustic signal to transmission processor 12.

Note that microphone 11 is not limited to being provided in communication terminal 1 as illustrated in FIG. 1. Communication terminal 1 need not include a microphone, and for example, may be connected (e.g., wired connection or radio connection) to an external microphone (not illustrated). Alternatively, communication terminal 1 may switch between, for example, internally provided microphone 11 and an external microphone.

Microphone 11 may be, for example, a stereo microphone. The stereo microphone may be configured using, for example, an omnidirectional microphone, a unidirectional microphone, or a bidirectional microphone. For example, two omnidirectional microphones arranged in parallel are called an "A-B microphone". For example, two unidirectional microphones arranged with opening angle so that sound collecting areas of the microphones overlap with each other are called an "X-Y microphone". For example, a unidirectional microphone and a bidirectional microphone arranged together are called an "M-S microphone". For example, two unidirectional microphones with a distance of 17 cm and an angle of 110 degrees are called an "Office de Radiodiffusion Television Francalse (ORTF) microphone", and two unidirectional microphones with a distance of 30 cm and an angle of 90 degrees are called an "Nederlandse Omroep Stichting (NOS) microphone".

An audio acoustic signal outputted from the M-S microphone is an "M/S format" signal, for example. An audio acoustic signal outputted from the A-B microphone, X-Y microphone, ORTF microphone, and NOS microphone is an "UR format" signal, for example.

Transmission processor 12, for example, encodes the audio acoustic signal inputted from microphone 11, and transmits the encoded data to communication terminal 2. Transmission processor 12 includes, for example, codec negotiator 121 and codec 122.

Codec negotiator 121 performs negotiation on a session for communication with, for example, communication terminal 2, which is a counterpart device of communication terminal 1. Codec negotiator 121 may perform negotiation on a codec available for the communication, for example. Codec negotiator 121 may also perform negotiation on a signal format (i.e., format) conversion capability (e.g., also referred to as an output conversion capability or an output conversion function) for a stereo signal in a codec of communication terminal 2, for example. In other words, codec negotiator 121 (e.g., corresponding to reception circuitry) may receive information on the output conversion capability of communication terminal 2 in the session negotiation between communication terminal 1 and communication terminal 2. Codec negotiator 121 outputs, for example, the result of the negotiation (e.g., information on the type of the codec or the output conversion capability) to codec 122.

The information on the output conversion capability (e.g., referred to as "output conversion capability information") may be, for example, information indicating whether the signal format of a stereo signal is convertible or not convertible from the M/S format to the L/R format in communication terminal 2. Note that whether it is "convertible" or "not convertible" may mean whether the conversion is "supported" or "not supported". In other words, the output conversion capability information may be, for example, information indicating whether communication terminal 2 includes a functional unit (conversion controller 2122 to be described later) for converting an M/S format signal into an L/R format signal. For example, the output conversion capability information may be indicated from communication terminal 2 to communication terminal 1 in the session negotiation.

For example, codec 122 encodes the audio acoustic signal inputted from microphone 11, and outputs the encoded data. Codec 122 includes, for example, conversion controller 1221 (e.g., corresponding to control circuitry) and encoder 1222 (e.g., corresponding to encoding circuitry).

Conversion controller 1221 controls the conversion of the signal format of the stereo signal (i.e., signal format of signal to be encoded in encoder 1222) inputted from microphone 11. For example, conversion controller 1221 may determine the signal format (e.g., M/S format or UR format) of the signal to be inputted to encoder 1222 based on at least one of information on the type of the codec or the output conversion capability inputted from codec negotiator 121 and information indicating the type of microphone 11 (hereinafter referred to as "microphone type information").

Conversion controller 1221 outputs, for example, the signal inputted from microphone 11 or the converted signal to encoder 1222. For example, conversion controller 1221 may generate information indicating the determined signal format (hereinafter referred to as "signal format information") and output the generated information to encoder 1222.

Encoder 1222 encodes (e.g., stereo-encodes) the signal inputted from conversion controller 1221, and outputs the encoded data. Encoder 1222 may also encode and output the signal format information inputted from conversion controller 1221.

Note that an exemplary operation of codec 122 will be described later.

Display device 13 may, for example, display an image that receives a user's operation of communication terminal 1. Display device 13 may also output information indicating a content of the user's operation to another functional unit (e.g., transmission processor 12) of communication terminal 1, for example. Display device 13 is, for example, a device such as a liquid crystal display.

[Exemplary Configuration of Communication Terminal 2]

Communication terminal 2 illustrated in FIG. 1 includes, for example, reception processor 21 (corresponding to a decoding apparatus), speaker 22, and display device 23.

Reception processor 21 receives, for example, the encoded data (or also referred to as a transmission bit stream) transmitted from communication terminal 1, and outputs a decoded audio acoustic signal obtained by decoding the encoded data to speaker 22. Reception processor 21 includes codec negotiator 211 and codec 212, for example.

Codec negotiator 211 performs negotiation on a session for communication with, for example, communication terminal 1, which is a counterpart device of communication terminal 2. Codec negotiator 211 may perform negotiation on a codec available for the communication or for negotiation on the output conversion capability in the codec of communication terminal 2, for example. The result of the negotiation in codec negotiator 211 (e.g., information on the type of the codec or the output conversion capability information) may be indicated to communication terminal 1, for example.

For example, codec 212 decodes the encoded data and outputs the decoded data (e.g., also referred to as a decoded audio acoustic signal) to speaker 22. Codec 212 includes, for example, decoder 2121 (e.g., corresponding to decoding circuitry) and conversion controller 2122 (e.g., corresponding to control circuitry).

For example, decoder 2121 decodes the encoded data encoded in communication terminal 1 and outputs the decoded data to conversion controller 2122. Decoder 2121 also decodes the signal format information transmitted from communication terminal 1, for example, and outputs the decoded information to conversion controller 2122.

Conversion controller 2122 controls the conversion of the signal format of the decoded data (e.g., decoded data of stereo signal) inputted from decoder 2121. For example, conversion controller 2122 may determine the signal format of the decoded data based on the signal format (e.g., M/S format or L/R format) indicated in the signal format information.

Note that an exemplary operation of codec 212 will be described later.

Speaker 22 is, for example, a sound output device, and converts the decoded data inputted from codec 212 into sound (e.g., voice or acoustic sound), and outputs the sound.

Note that speaker 22 is not limited to being provided in communication terminal 2 as illustrated in FIG. 1. Communication terminal 2 need not include a speaker, and for example, may be connected (e.g., wired connection or radio connection) to an external output device (not illustrated), such as a speaker or headphones. Alternatively, communication terminal 2 may switch between, for example, internally provided speaker 22 and an external output device.

Display device 23 may, for example, display an image that receives a user's operation of communication terminal 2. Display device 23 may also output information indicating a content of the user's operation to another functional unit (e.g., reception processor 21) of communication terminal 2, for example. Display device 23 is, for example, a display device such as a liquid crystal display.

[Exemplary Negotiation]

Next, a description will be given of exemplary negotiation between communication terminal 1 (e.g, codec negotiator 121) and communication terminal 2 (e.g, codec negotiator 211).

Figure 2:
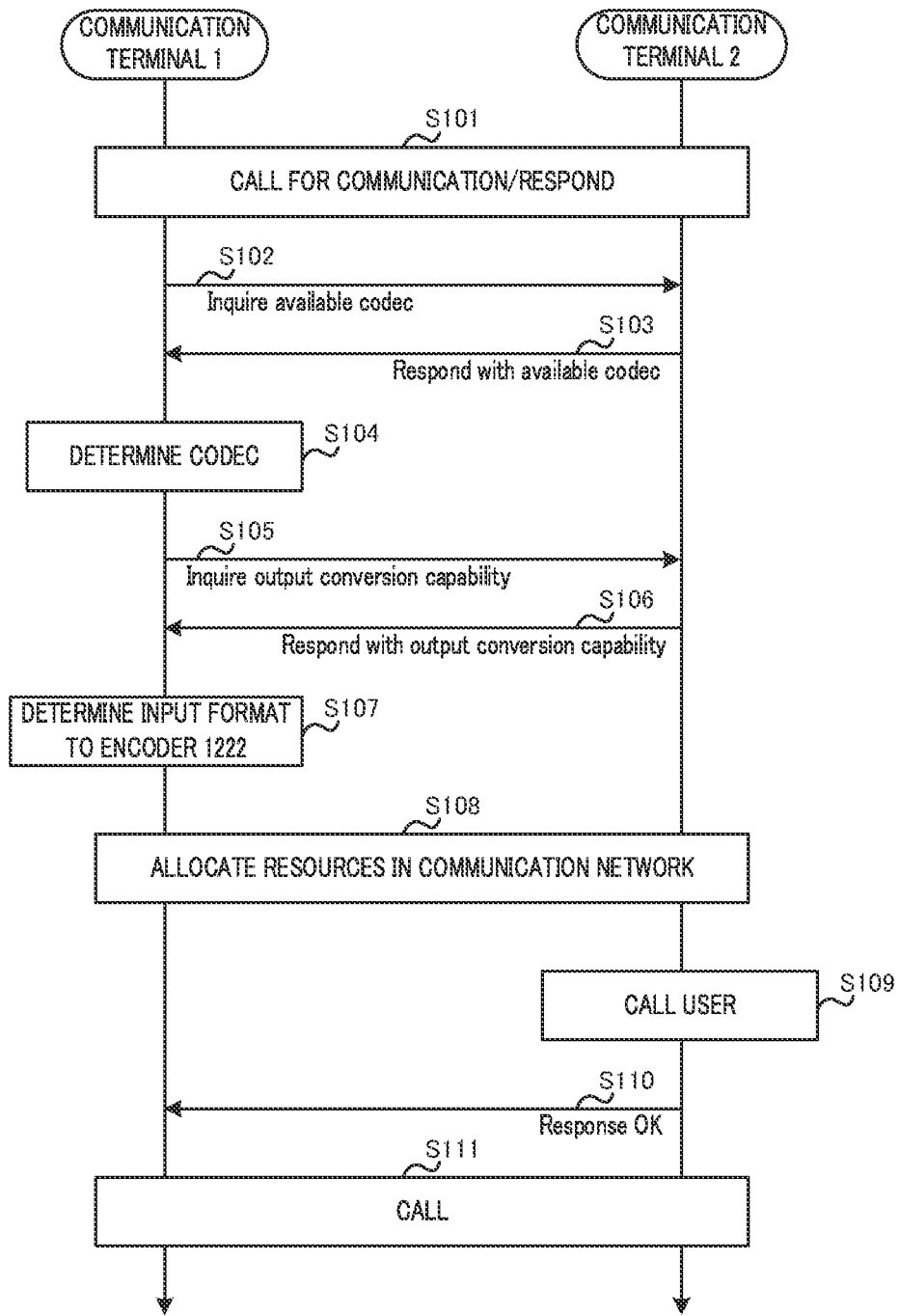
FIG. 2 is a sequence diagram describing exemplary session negotiation according to Embodiment 1.

FIG. 2 is a sequence diagram describing an exemplary negotiation operation between communication terminal 1 and communication terminal 2.

In FIG. 2, communication terminal 1 and communication terminal 2 perform a communication call and respond to the call (S101).

Communication terminal 1 inquires an available codec of communication terminal 2, for example (S102). Communication terminal 2 responds to the inquiry about an available codec (S103). The response on the available codec may include, for example, information on the type of a codec available in communication terminal 2. Communication terminal 1 confirms (i.e., determines) the codec to be used for the communication between communication terminal 1 and communication terminal 2 based on the response on the available codec from communication terminal 2 (S104).

Communication terminal 1 inquires the output conversion capability of communication terminal 2, for example (S105). Communication terminal 2 responds to the inquiry about the output conversion capability (S106). The response to the inquiry about the output conversion capability may include, for example, the output conversion capability information of communication terminal 2. Communication terminal 1 determines the signal format (or also referred to as the input format) of a signal to be encoded in encoder 1222 based on the output conversion capability information from communication terminal 2 (S107).

For example, communication terminal 1 and communication terminal 2 allocate resources in the communication network between communication terminal 1 and communication terminal 2 (S108).

Communication terminal 2 performs a user call (S109), and transmits a response OK message to communication terminal 1 (S110) upon a response form the user, for example. Then, the call is initiated between communication terminal 1 and communication terminal 2 (Sill).

Note that the processing for the output conversion capability (e.g., processing of S105 and S106) may be performed in the processing for the available codec (e.g., processing of S102 and S103). Alternatively, in the processing for the output conversion capability, communication terminal 2 may indicate the output conversion capability information to communication terminal 1 during the negotiation without the inquiry from communication terminal 1 (e.g., processing of S105).

In addition, the processing for the output conversion capability illustrated in FIG. 2 (processing of S105 and S106) is not limited to the above case where communication terminal 1 inquires the output conversion capability of communication terminal 2. When the encoded data communication from communication terminal 2 to communication terminal 1 is assumed, for example, communication terminal 2 may inquire the output conversion capability of communication terminal 1, which corresponds to the processing of S105. In this case, communication terminal 1 may respond to the inquiry about the output conversion capability from communication terminal 2, which corresponds to the processing of S106. This processing is, for example, based on the assumption of the encoded data communication from communication terminal 2 to communication terminal 1 (e.g., bidirectional communication), and the encoded data is decoded in communication terminal 1 and outputted, and it is thus useful as to whether the signal format needs to be converted at the time of encoding in communication terminal 2.

[Exemplary Operation of Communication Terminal 1]

Next, an exemplary operation of communication terminal 1 (transmission side) will be described.

Figure 3:
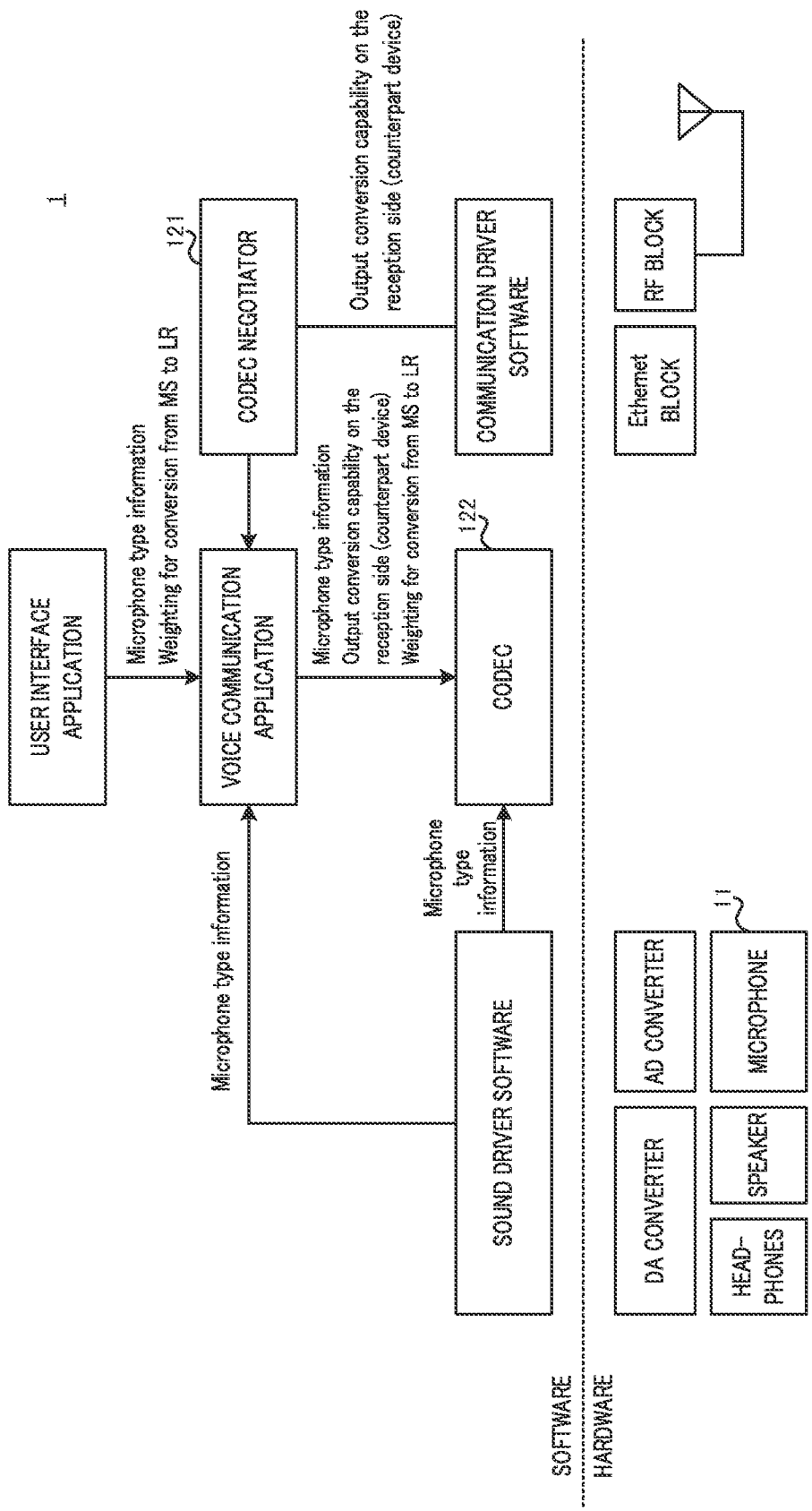
FIG. 3 illustrates exemplary configurations of software and hardware of a communication terminal according to Embodiment 1.

FIG. 3 illustrates exemplary configurations of software and hardware of communication terminal 1.

Software of communication terminal 1 may include, for example, a user interface application, a voice communication application, communication driver software, codec negotiator 121, sound driver software, and codec 122.

Hardware of communication terminal 1 may include, for example, a radio frequency (RF) block, an Ethernet (registered trademark) block, an Analog-to-Digital (AD) converter, microphone 11, a Digital-to-Analog (DA) converter, a speaker, and headphones. Note that at least one of the portions of the hardware illustrated in FIG. 3 may be an external device, which is not provided in communication terminal 1, and may be connected to communication terminal 1.

The user interface application receives a user's operation via display device 13, for example, and outputs input information corresponding to the user's operation to the voice communication application.

The voice communication application controls processing on voice communication for codec 122 based on, for example, information inputted from the user interface application, codec negotiator 121, or the sound driver software.

The sound driver software controls, for example, hardware related to input and output of sound, such as microphone 11, the AD converter, DA converter, headphones, and speaker.

The communication driver software controls, for example, hardware related to communication, such as the RF block or Ethernet block.

Method 1-1, Method 1-2, and Method 1-3 will be described here as exemplary methods of inputting the microphone type information (e.g., M/S or L/R format) to codec 122 in communication terminal 1. Note that the method of inputting the microphone type information to codec 122 is not limited to these methods, and may be another method.

In Method 1-1, for example, the voice communication application acquires the microphone type information from the sound driver software, and outputs the acquired microphone type information to codec 122.

In Method 1-2, for example, codec 122 acquires the microphone type information from the sound driver software.

In Method 1-3, for example, the user interface application outputs the microphone type information indicating the microphone type selected by a user to codec 122 via the voice communication application. In the case of Method 1-3, for example, display device 13 may display a screen for selecting the microphone type, such as the M-S microphone and the A-B microphone, and generate the microphone type information corresponding to the microphone type selected by the user.

Further, when the microphone is replaced in communication terminal 1 during the communication, or when the user intentionally switches the microphone type information, for example, the updated microphone type information may be inputted to codec 122 using any of Method 1-1, Method 1-2, and Method 1-3.

Next, an exemplary method of inputting the output conversion capability information to codec 122 in communication terminal 1 will be described.

For example, during the negotiation by codec negotiator 121, the communication driver software acquires (i.e., receives) the output conversion capability information transmitted from communication terminal 2, which is a counterpart device of communication terminal 1, and outputs the information to codec 122 via codec negotiator 121 and the voice communication application. Note that the method of inputting the output conversion capability information to codec 122 is not limited to this method, and may be another method.

[Exemplary Operation of Conversion Controller 1221]

Next, a description will be given of an exemplary operation of conversion controller 1221 in codec 122 of communication terminal 1.

Figure 4:
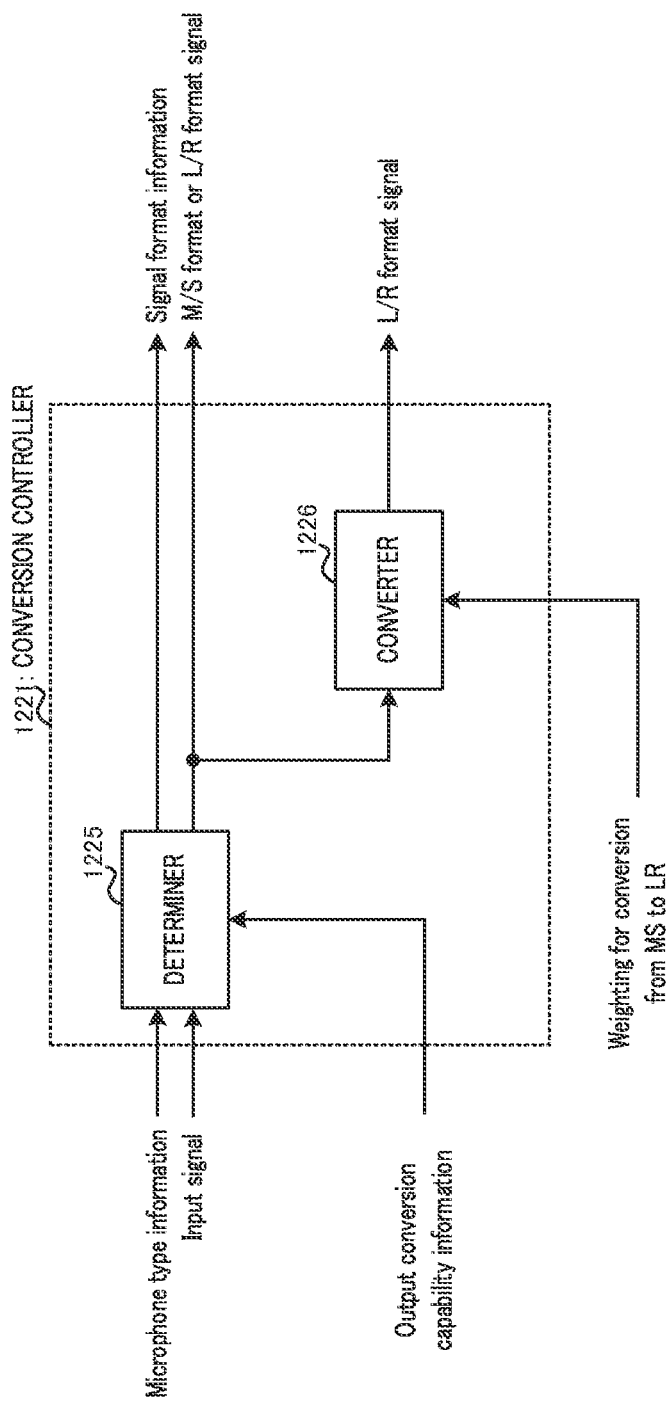
FIG. 4 is a block diagram illustrating an exemplary configuration of a conversion controller according to Embodiment 1.

FIG. 4 is a block diagram illustrating an exemplary configuration of conversion controller 1221. Conversion controller 1221 illustrated in FIG. 4 includes, for example, determiner 1225 and converter 1226.

Determiner 1225 determines whether to convert the signal format of an input signal (e.g., audio acoustic signal) based on, for example, the microphone type information and the output conversion capability.

For example, when the microphone type information indicates the "M/S format" and the output conversion capability information indicates "convertible from M/S format to UR format", determiner 1225 determines not to convert the signal format (M/S format) of the input signal. In this case, determiner 1225 outputs the M/S format signal to encoder 1222.

For example, when the microphone type information indicates the "M/S format" and the output conversion capability information indicates "not convertible from M/S format to L/R format", determiner 1225 determines to convert the signal format (M/S format) of the input signal to the L/R format. In this case, determiner 1225 outputs the M/S format input signal to converter 1226.

Further, when the microphone type information indicates the "L/R format", for example, determiner 1225 outputs the input signal to encoder 1222 without converting the signal format (L/R format) regardless of the output conversion capability information.

Determiner 1225 outputs signal format information indicating the determination result of the signal format of the input signal (e.g., determined signal format) to encoder 1222.

Note that the method of determining the signal format conversion in determiner 1225 is not limited to the method based on the microphone type information, and another method may be used. For example, determiner 1225 may determine the microphone type based on the correlation of the two channels (e.g., pair of M and S signals or pair of L and R channel signals) composing the input signal, and determine whether to convert the signal format. The correlation of the two channels may be determined based on, for example, at least one of information portions indicating the relationship between the two channels, such as the gain difference, time difference, phase difference, or difference in the spectral structure when converted to frequency domain, between the two channels.

For example, when microphone 11 used in communication terminal 1 is the M-S microphone (in other words, when a microphone supporting the UR format is not used), determiner 1225 may control the conversion of the signal format based on the output conversion capability information.

Converter 1226 converts, for example, the M/S format input signal inputted from determiner 1225 into the L/R format input signal, and outputs the converted UR format signal to encoder 1222.

In other words, conversion controller 1221 converts the M/S format sound signal inputted to transmission processor 12 into the UR format when the output conversion capability information indicates that the conversion to the UR format is not supported. In contrast, conversion controller 1221 does not apply the above-described conversion to the M/S format sound signal inputted to transmission processor 12 when the output conversion capability information indicates that the conversion to the L/R format is supported. In addition, conversion controller 1221 does not apply the above-described conversion when an UR format sound signal is inputted to transmission processor 12.

Converter 1226 may also perform weighting to the M signal and S signal when converting from the M/S format to the UR format. The weighting to the M and S signals can adjust the sense of sound spread.

Converter 1226 may convert the M signal (M) and the S signal (S) into the L channel signal (L) and the R channel signal (R) according to, for example, the following Expression 1:

$$L = \alpha M + \beta S \quad [1]$$

$$R = \alpha M - \beta S \quad \text{(Expression 1).}$$

Here, $\alpha$ and $\beta$ represent weighting factors, where $0 \leq \alpha \leq 1$, $0 \leq \beta \leq 1$, and $\alpha + \beta = 1$. For example, $\alpha$ and $\beta$ may be respectively set to 1 and 0 when the sound spread is minimized (or represented by 0%), and $\alpha$ and $\beta$ may be respectively set to 0 and 1 when the sound spread is maximized (or represented by 100%). In other words, when $\alpha$ has a greater value (when $\beta$ has a smaller value), the M signal is emphasized and the sense of sound spread is reduced. When $\alpha$ has a smaller value (when $\beta$ has a greater value), the S signal is emphasized and the sense of sound spread is increased.

Method 2-1, Method 2-2, and Method 2-3 will be described as exemplary methods of setting weighting factors (e.g., $\alpha$ and $\beta$) for the conversion from the M/S format to the LR format. Note that the method of setting the weighting factors (e.g., $\alpha$ and $\beta$) is not limited to these methods, and may be another method.

In Method 2-1, for example, the user interface application may output weighting factors $\alpha$ and $\beta$ (or parameter associated with the weighting factors) selected (i.e., set) by a user to codec 122 via the voice communication application. In the case of Method 2-1, for example, display device 13 may display a selection screen (or input screen) for a sound spread parameter (e.g., 0% to 100%), and generate information indicating the weighting factors corresponding to the parameter selected by the user (e.g., "weighting for conversion from M/S to L/R" illustrated in FIG. 3 or 4). Also, display device 13 may preset a plurality of candidate values for weighting factors $\alpha$ and $\beta$, e.g., 10%, 20%, ..., 100%, and let the user select one of the candidate values.

In Method 2-2, for example, the voice communication application may set weighting factors $\alpha$ and $\beta$, and output information indicating the set weighting factors $\alpha$ and $\beta$ to codec 122.

In Method 2-3, for example, codec 122 may set weighting factors $\alpha$ and $\beta$.

Exemplary methods of setting weighting factors $\alpha$ and $\beta$ have been described, thus far.

Communication terminal 1 may transmit the signal format information generated in conversion controller 1221 to communication terminal 2 in addition to transmitting an M/S or UR format signal.

Methods 3-1 to 3-4 will be described as exemplary methods of transmitting the signal format information. Note that the method of transmitting the signal format information is not limited to these methods, and may be another method.

In Method 3-1, for example, when an audio acoustic signal is encoded in encoder 1222, the signal format information may also be encoded and transmitted in a transmission 10 bit stream.

In Method 3-2, for example, codec negotiator 121 may transmit the signal format information to communication terminal 2 when establishing a session negotiation.

In Method 3-3, for example, the signal format information need not be included in a transmission bit stream encoded in encoder 1222, and may be transmitted in a different signal (e.g., session control message or header of communication protocol) in each frame.

In Method 3-4, for example, the signal format information need not be included in a transmission bit stream encoded in encoder 1222, and may be transmitted in a different signal (e.g., session control message or header of communication protocol) at the initial transmission and when the microphone is switched.

Exemplary methods of transmitting the signal format information have been described, thus far.

Note that, for the two channel signals inputted to conversion controller 1221 or the two channel signals after conversion in conversion controller 1221, when the difference between the gain of one channel and the gain of the other channel is extremely large (for example, when the gain difference is equal to or greater than a threshold), codec 122 may encode the channel with a greater gain among the two channels based on the mono codec and need not encode the channel with a smaller gain. In other words, the encoded data of a channel with a greater gain among the two channels may be transmitted to communication terminal 2.

Alternatively, for the two channels (e.g., L channel and R channel) after conversion from the M/S format to the L/R format, when the difference between the gain of one channel and the gain of the other channel is extremely large (for example, when the gain difference is equal to or greater than a threshold), codec 122 may encode the channel with a greater gain among the two channels based on the mono codec and need not encode the channel with a smaller gain. In other words, the encoded data of a channel with a greater gain among the two channels may be transmitted to communication terminal 2.

[Exemplary Operation of Communication Terminal 2]

Next, an exemplary operation of communication terminal 2 (reception side) will be described.

Figure 5:
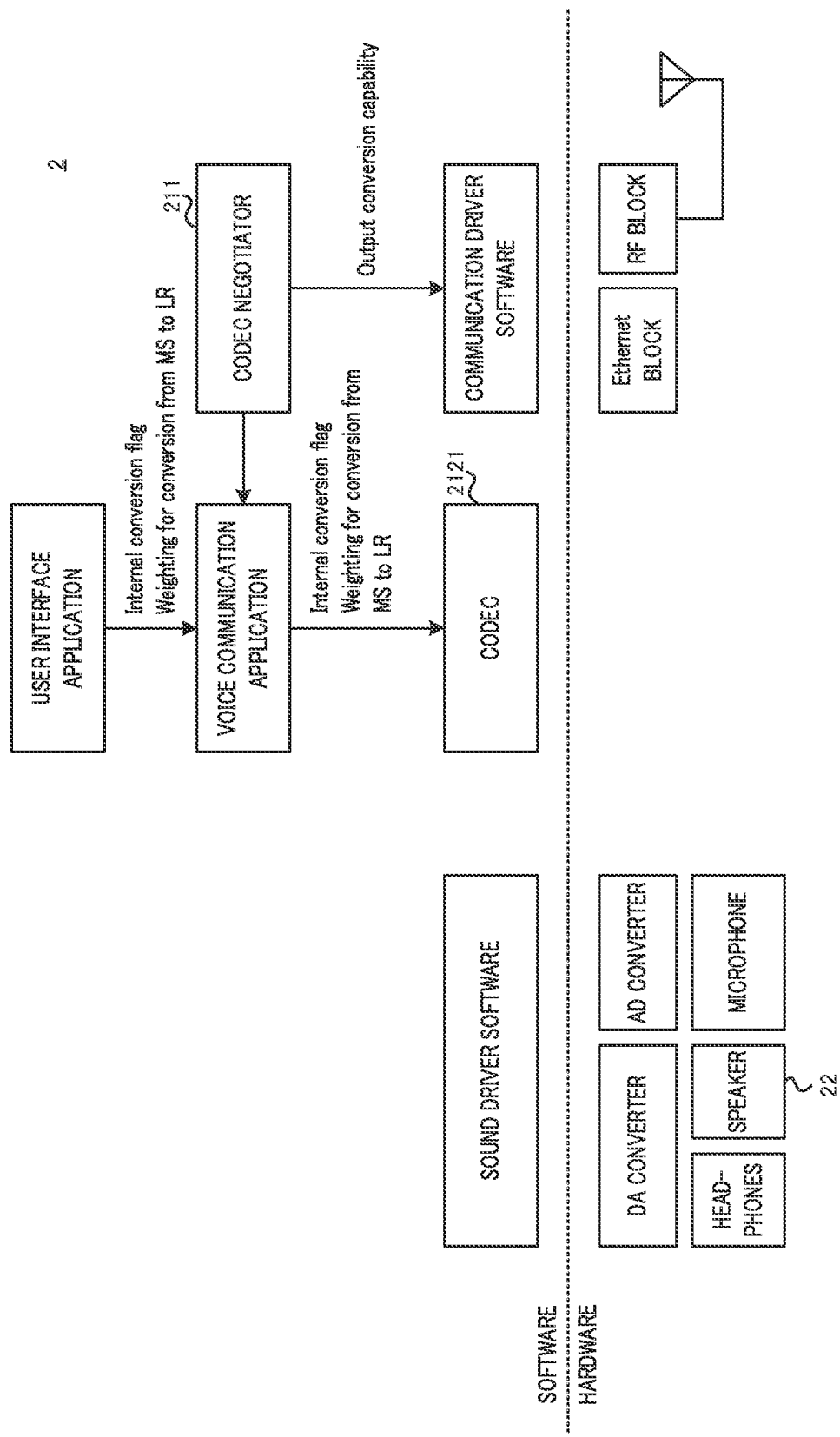
FIG. 5 illustrates exemplary configurations of software and hardware of a communication terminal according to Embodiment 1.

FIG. 5 illustrates exemplary configurations of software and hardware of communication terminal 2.

Software of communication terminal 2 may include, for example, a user interface application, a voice communication application, communication driver software, codec negotiator 211, sound driver software, and codec 212.

Hardware of communication terminal 2 may include, for example, an RF block, an Ethernet block, an A/D converter, a microphone, a D/A converter, speaker 22, and headphones. Note that at least one of the portions of the hardware illustrated in FIG. 5 may be an external device, which is not provided in communication terminal 2, and may be connected to communication terminal 2.

The user interface application receives a user's operation via display device 23, for example, and outputs input information corresponding to the user's operation to the voice communication application.

The voice communication application controls processing on voice communication for codec 212 based on, for example, information inputted from the user interface application or codec negotiator 211.

The sound driver software controls, for example, hardware related to input and output of sound, such as the microphone, AD converter. DA converter, headphones, and speaker 22.

The communication driver software controls, for example, hardware related to communication, such as the RF block or Ethernet block. For example, the communication driver software may transmit the output conversion capability information indicating the output conversion capability of communication terminal 2 to communication terminal 1 in the negotiation processing by codec negotiator 211.

[Exemplary Operation of Conversion Controller 2122]

Next, a description will be given of an exemplary operation of conversion controller 2122 in codec 212 of communication terminal 2.

Figure 6:
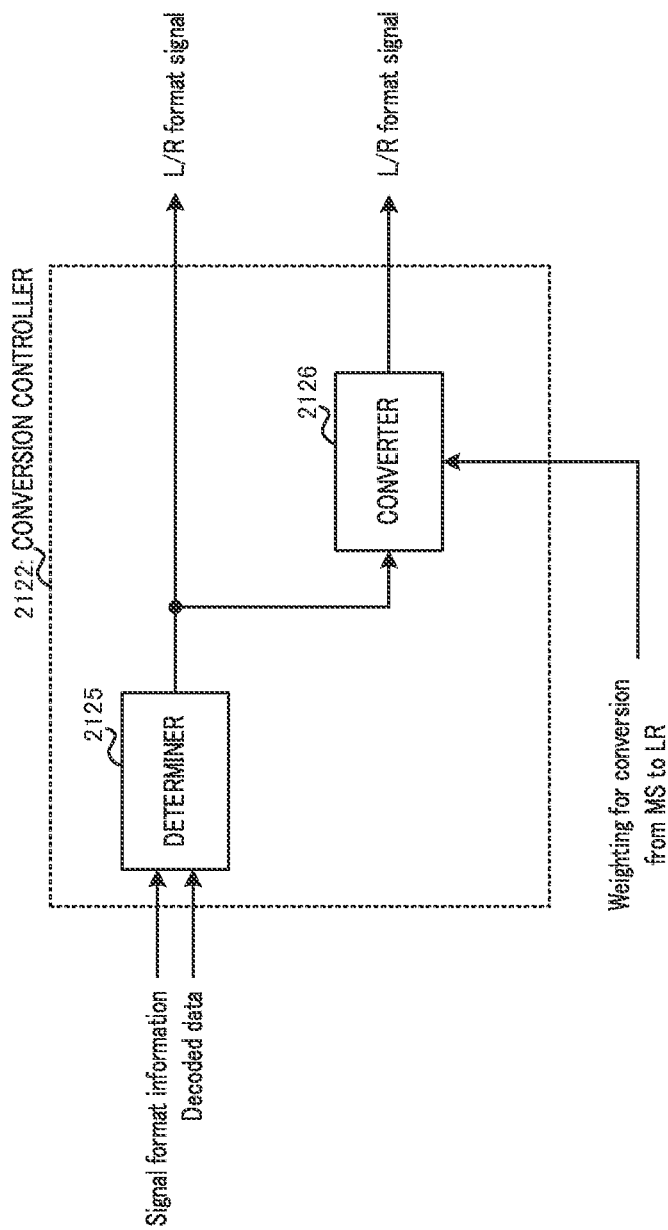
FIG. 6 is a block diagram illustrating an exemplary configuration of a conversion controller according to Embodiment 1.

FIG. 6 is a block diagram illustrating an exemplary configuration of conversion controller 2122. Conversion controller 2122 illustrated in FIG. 6 includes, for example, determiner 2125 and converter 2126.

For example, determiner 2125 may determine whether to convert the signal format of the decoded data based on the signal format (e.g., M/S format or L/R format) indicated in the signal format information.

For example, when the signal format information indicates the "M/S format", determiner 2125 determines to convert the signal format (M/S format) of the decoded data into the UR format. In this case, determiner 2125 outputs the M/S format decoded data to converter 2126.

For example, when the signal format information indicates the "UR format", determiner 2125 determines not to convert the signal format (UR format) of the decoded data. In this case, determiner 2125 outputs the L/R format decoded data to speaker 22, for example.

Converter 2126, for example, converts the M/S format signal inputted from determiner 2125 into the LR format signal, and outputs the converted L/R format signal to speaker 22.

In other words, conversion controller 2122 converts the encoded data for the M/S format sound signal inputted to reception processor 21 into the L/R format when the output conversion capability information indicates that the conversion to the UR format is supported.

Converter 2126 may also perform weighting to the M signal and S signal when converting from the M/S format to the L/R format. The weighting to the M and S signals can adjust the sense of sound spread. Converter 2126 may convert the M signal (M) and the S signal (S) into the L channel signal (L) and the R channel signal (R) according to Expression 1, for example.

Note that the weighting parameters (e.g., a and R in Expression 1) for communication terminal 2 may be set by communication terminal 2 in the same manner as communication terminal 1, or may be indicated to communication terminal 2 from communication terminal 1.

An exemplary operation of communication terminal 2 has been described, thus far.

Note that communication terminal 2 that is not capable of converting the MIS format into the UR format is assumed not to include conversion controller 2122 illustrated in FIG. 1, for example. Such communication terminal 2 indicates, to communication terminal 1, the output conversion capability information indicating that the signal format cannot be converted, for example, in the negotiation with communication terminal 1. In this case, communication terminal 1 transmits encoded data obtained by encoding an UR format signal as described above, and communication terminal 2 decodes the L/R format encoded data and outputs an audio acoustic signal.

As described above, in the present embodiment, communication terminal 1 (e.g., encoding apparatus) controls the conversion of the signal format of an audio acoustic signal based on the output conversion capability information of communication terminal 2 (e.g., decoding apparatus) that decodes encoded data of the audio acoustic signal, and encodes the audio acoustic signal following the control of the signal format conversion.

Communication terminal 2 decodes the encoded data encoded in communication terminal 1 based on information on the conversion capability of the signal format of the audio acoustic signal in communication terminal 2, and controls the conversion of the signal format.

According to the present embodiment, communication terminals 1 and 2 can perform encoding or decoding in accordance with the signal format of an audio acoustic signal.

For example, for communication terminal 2 that is capable of converting the M/S format into the L/R format, communication terminal 1 encodes, in a codec, an M/S format signal acquired by an M-S microphone as it is. Even in this situation, communication terminal 2 can convert the M/S format signal to the L/R format signal in reception processor 21 and output a stereo signal.

For example, for communication terminal 2 that is not capable of converting the M/S format into the LR format, communication terminal 1 converts an M/S format signal acquired by an M-S microphone into an UR format signal and encodes the signal in a codec. This conversion allows communication terminal 2 to output an L/R format stereo signal without converting the signal format in reception processor 21.

As described above, according to the present embodiment, the control of the signal format conversion in communication terminal 1 prevents communication terminal 2 from, for example, playing an M signal and S signal in an L channel and R channel of headphones or a speaker, thereby preventing a user from feeling uncomfortable. In other words, it is possible to prevent the output of an M/S format signal acquired by an M-S microphone without being converted into the L/R format in communication terminal 2.

For example, even when the input of an L/R format signal to a codec is assumed such as in EVS, the conversion of the signal format in communication terminal 1 prevents deterioration of the encoding performance of the codec due to an M/S format signal. In other words, communication terminal 1 may encode an input signal based on the signal format assumed in an existing codec such as EVS, for example.

As described above, the present embodiment makes it possible to perform stereo encoding appropriately in accordance with a stereo microphone. For example, in the present embodiment, stereo encoding can be appropriately performed on an M/S format signal acquired by an M-S microphone.

Embodiment 2

In Embodiment 1, a function relating to the conversion control of the signal format (e.g., conversion controller 2122) is provided inside a codec in a communication terminal on the reception side, as illustrated in FIG. 1, for example. In the present embodiment, in contrast, the function relating to the conversion control of the signal format is provided outside the codec in the communication terminal on the reception side.

Note that the configuration of communication terminal 1 according to the present embodiment may be the same as in Embodiment 1, for example.

Figure 7:
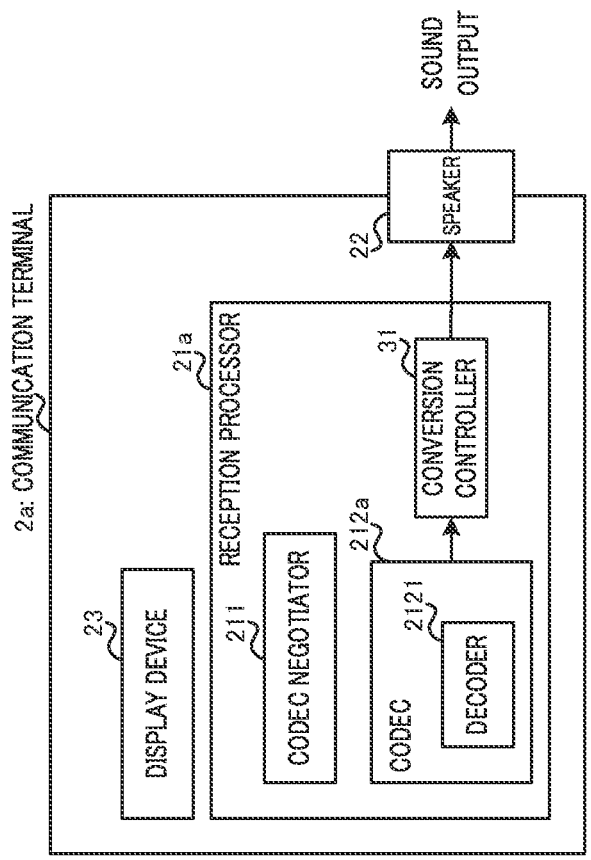
FIG. 7 is a block diagram illustrating an exemplary configuration of a communication terminal according to Embodiment 2.

FIG. 7 is a block diagram illustrating an exemplary configuration of communication terminal 2a according to the present embodiment.

Reception processor 21a of communication terminal 2a illustrated in FIG. 7 includes conversion controller 31 outside codec 212a. Codec 212a does not have a function of performing the conversion control of the signal format. In other words, decoder 2121 among decoder 2121 and conversion controller 31 may be included in codec 212a in communication terminal 2a.

Conversion controller 31 may be included in, for example, at least one of the voice communication application and sound driver software. Note that the operation of conversion controller 31 for the conversion control is, for example, the same as that of conversion controller 2122 in Embodiment 1.

Figure 8:
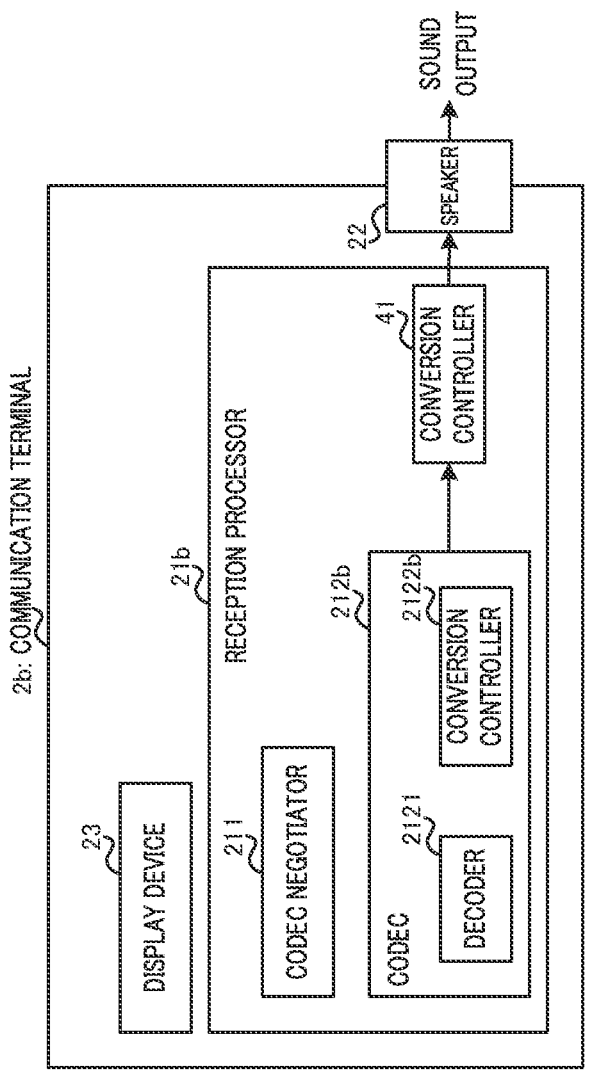
FIG. 8 is a block diagram illustrating an exemplary configuration of a communication terminal according to Embodiment 2.

FIG. 8 is a block diagram illustrating another exemplary configuration of communication terminal 2b according to the present embodiment.

Reception processor 21b of communication terminal 2b illustrated in FIG. 8 includes conversion controller 2122b inside codec 212b and conversion controller 41 outside codec 212b. Conversion controller 41 may be included in, for example, at least one of the voice communication application and sound driver software. Note that the operations of conversion controller 2122b and conversion controller 41 for the conversion control are, for example, the same as that of conversion controller 2122 in Embodiment 1.

For example, communication terminal 2b may perform the conversion control, such as the determination and conversion of the signal format, in one of conversion controller 2122b and conversion controller 41. For example, communication terminal 2b may operate based on an "internal conversion flag" indicating whether the conversion control is to be performed in conversion controller 2122b or conversion controller 41. A value of the internal conversion flag may be, for example, a value indicating that the conversion control is performed inside codec 212b (e.g., value: internally enabled) or a value indicating that the conversion control is performed outside codec 212 (e.g., value: internally disabled).

Figure 9:
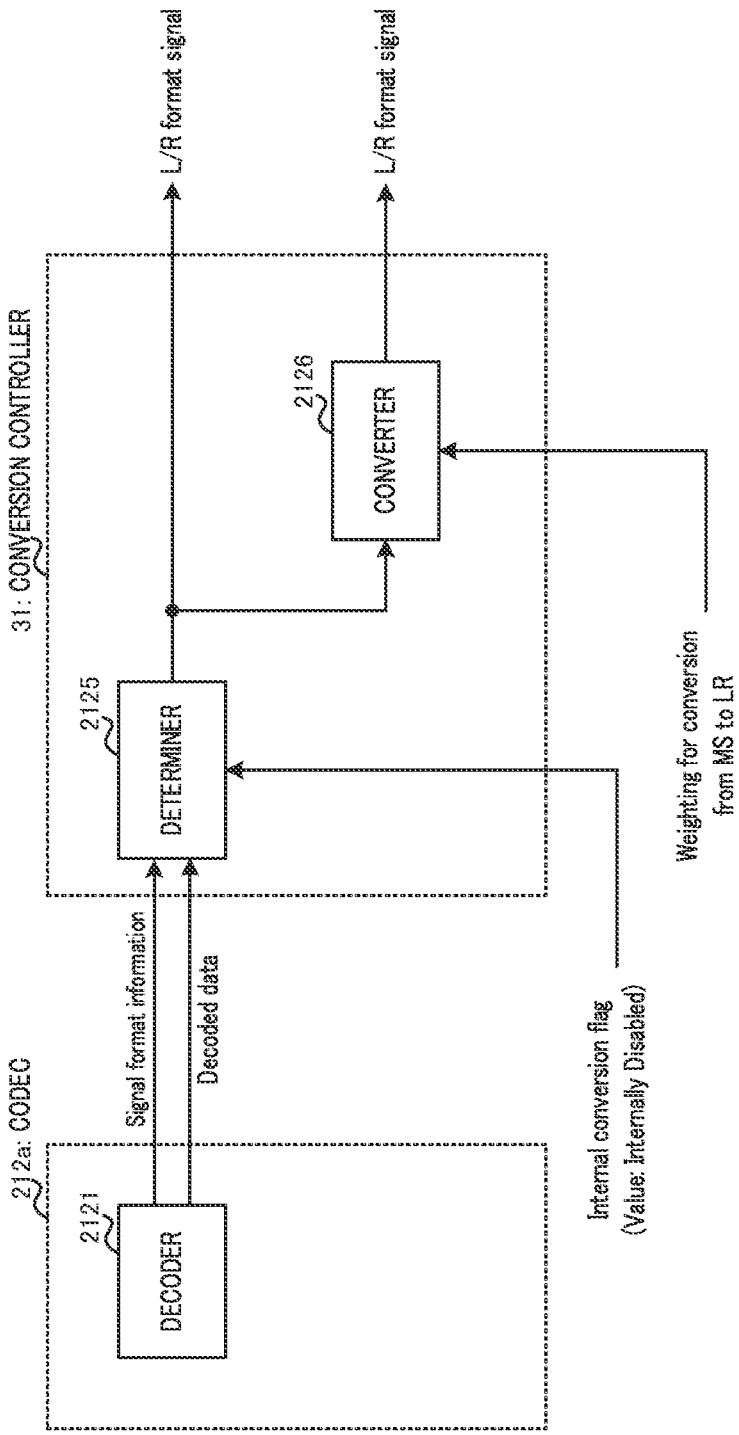
FIG. 9 illustrates exemplary operations of a codec and a conversion controller according to Embodiment 2.

FIG. 9 illustrates exemplary operations of codec 212a and conversion controller 31 illustrated in FIG. 7.

As illustrated in FIG. 9, conversion controller 31 is provided outside codec 212a and codec 212a does not have a function relating to the conversion control; accordingly, the value of the internal conversion flag is set to "internally disabled". Note that, in FIG. 9, the internal conversion flag is set to internally disabled and not set to internally enabled, for example, and thus the internal conversion flag is not necessarily used.

Conversion controller 31 determines whether to convert the signal format of the decoded data inputted from codec 212a, for example, based on the signal format indicated in the signal format information inputted from codec 212a.

For example, when the signal format indicated in the signal format information is the M/S format, conversion controller 31 converts the signal format of the decoded data from the M/S format to the UR format in converter 2126, and outputs the UR format signal. Further, conversion controller 31 may perform weighting to the M signal and S signal according to Expression 1, for example, at the time of the signal format conversion. Meanwhile, when the signal format indicated in the signal format information is the UR format, for example, conversion controller 31 outputs the UR format signal without converting the signal format.

Figure 10:
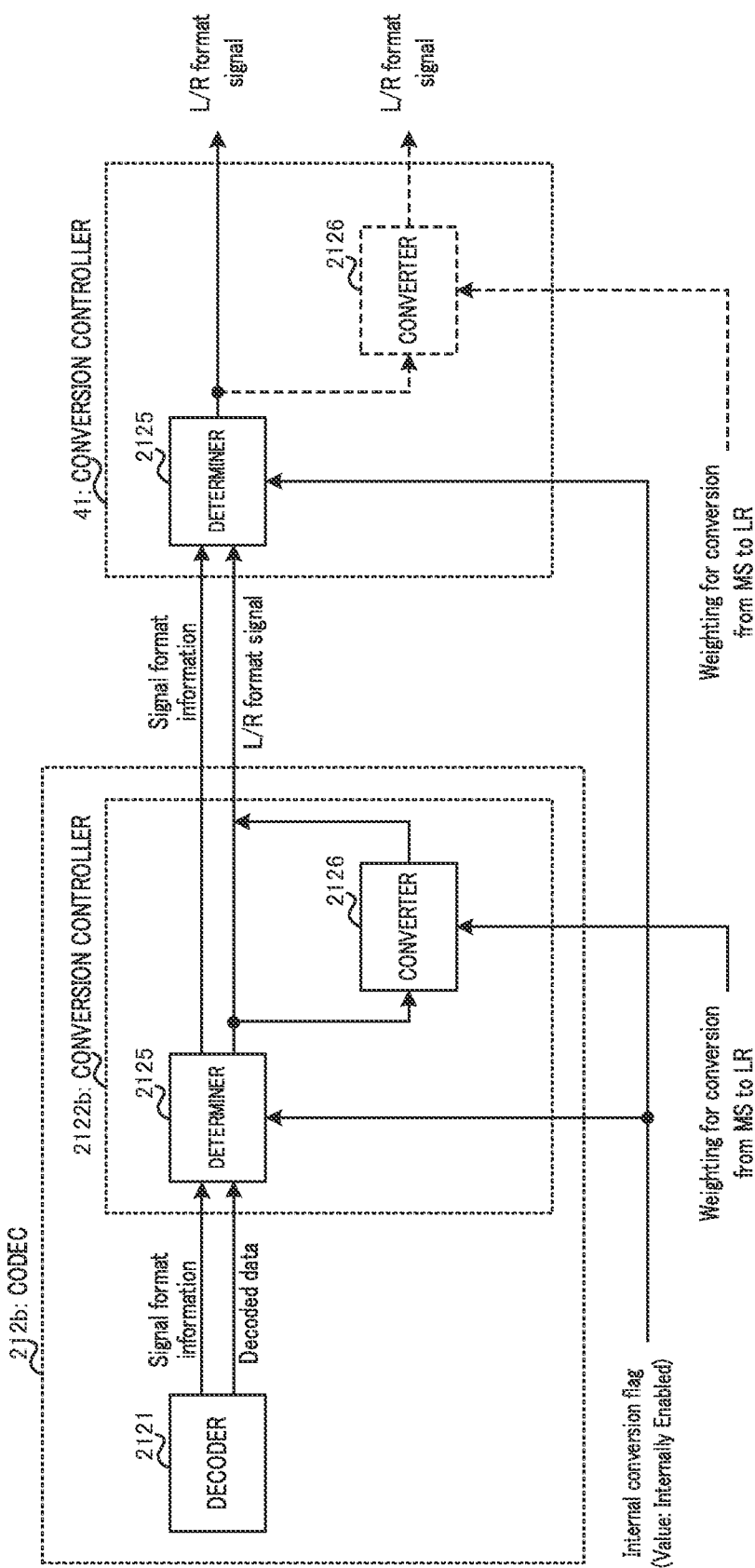
FIG. 10 illustrates exemplary operations of a codec and a conversion controller according to Embodiment 2.
Figure 11:
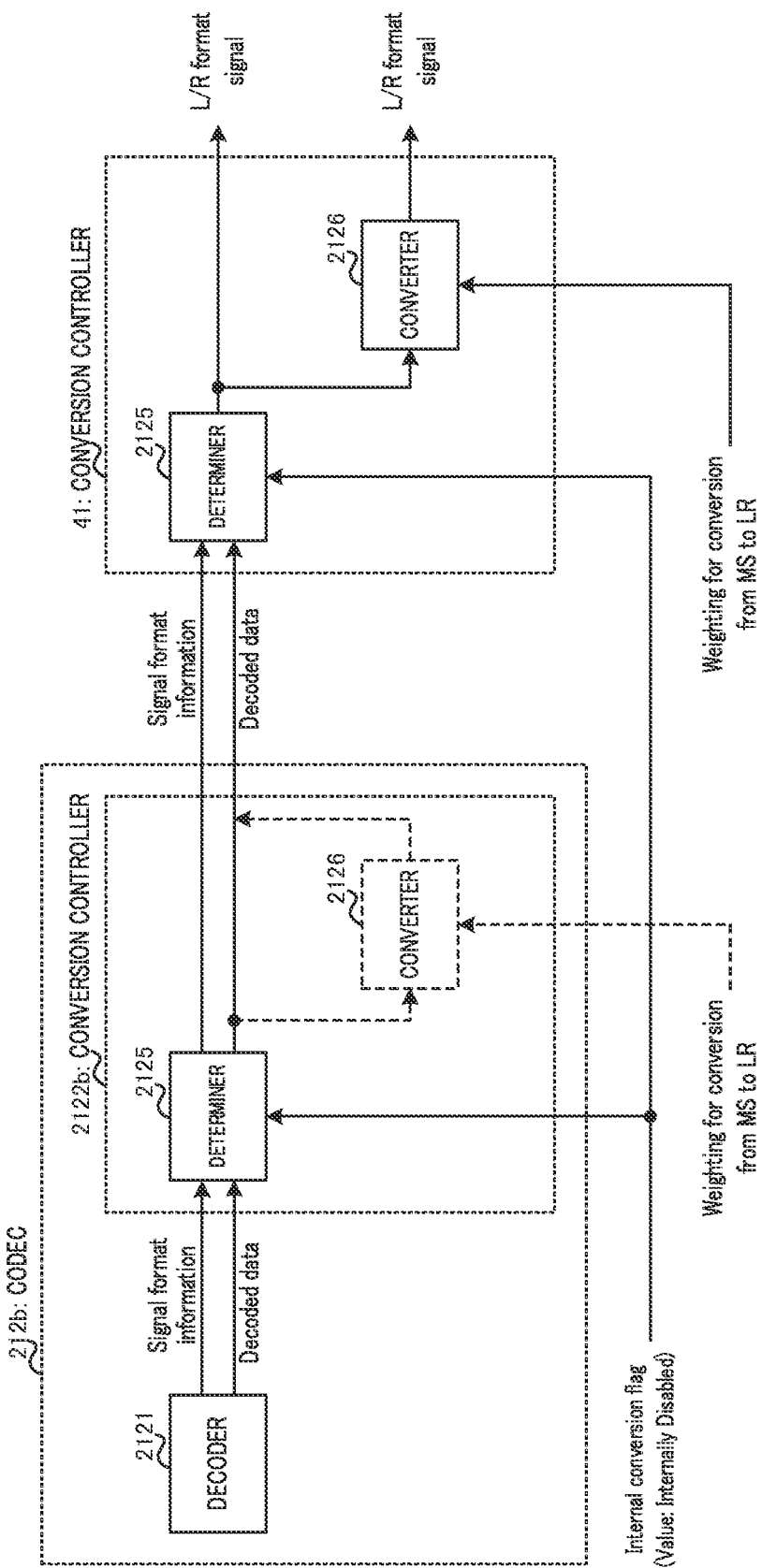
FIG. 11 illustrates exemplary operations of the codec and the conversion controller according to Embodiment 2.

FIGS. 10 and 11 illustrate exemplary operations of codec 212b and conversion controller 41 illustrated in FIG. 8.

As illustrated in FIGS. 10 and 11, conversion controller 2122b is provided inside codec 212b, and conversion controller 41 is provided outside codec 212b. The value of the internal conversion flag may be set to either "internally enabled (FIG. 10)" or "internally disabled (FIG. 11)", for example. Note that which of conversion controller 2122b and conversion controller 41 performs the conversion control (in other words, the setting of the internal conversion flag) may be set in any way by a system design or user's selection, for example.

As illustrated in FIG. 10, when the internal conversion flag indicates "internally enabled", for example, conversion controller 2122b determines whether to convert the signal format of the decoded data inputted from decoder 2121 based on, for example, the signal format indicated in the signal format information inputted from decoder 2121. When determining to convert the signal format, conversion controller 2122b converts the signal format of the decoded data. Conversion controller 2122b then outputs the signal format information and the LR format signal to conversion controller 41.

In FIG. 10, conversion controller 41 outputs the L/R format signal inputted from, for example, codec 212b (conversion controller 2122b) as it is. In other words, conversion controller 41 does not convert the signal format.

Meanwhile, as illustrated in FIG. 11, when the internal conversion flag indicates "internally disabled", for example, conversion controller 2122b outputs the signal format information and the decoded data inputted from decoder 2121 to conversion controller 41, for example. In other words, conversion controller 2122b does not convert the signal format.

In FIG. 11, conversion controller 41 determines whether to convert the signal format of the decoded data inputted from codec 212b based on, for example, the signal format indicated in the signal format information inputted from codec 212b (conversion controller 2122b). When determining to convert the signal format, conversion controller 41 converts the signal format of the decoded data. Conversion controller 41 then outputs the UR format signal.

Next, Method 4-1, Method 4-2, and Method 4-3 will be described as exemplary methods of setting the internal conversion flag. Note that the method of setting the internal conversion flag is not limited to these methods, and may be another method.

In Method 4-1, for example, the user interface application outputs the internal conversion flag selected (or set) by a user to conversion controllers 2122a and 2122b (e.g., codecs 212a and 212b) and conversion controllers 31 and 41 (e.g., voice communication application or sound driver software) via the voice communication application.

In Method 4-2, for example, the voice communication application determines which of conversion controllers 2122a and 2122b (i.e., inside codecs 212a and 212b) and conversion controllers 31 and 41 (i.e., outside codecs 212a and 212b) perform processing for the conversion control (e.g., determination and conversion of the signal format).

In Method 4-3, codecs 212a and 212b determine which of conversion controllers 2122a and 2122b (i.e., inside codecs 212a and 212b) and conversion controllers 31 and 41 (i.e., outside codecs 212a and 212b) perform processing for the conversion control (e.g., determination and conversion of the signal format).

As described above, in the communication terminal on the reception side, both the decoder and conversion controller may be included in the codec, or the decoder among the decoder and conversion controller may be included in the codec. This configuration enables appropriate stereo encoding in accordance with a stereo microphone as in Embodiment 1 even when the conversion control of the signal format is performed in either inside or outside the codec in the communication terminal on the reception side.

Embodiment 3

The configuration of communication terminal 1 according to the present embodiment is the same as in Embodiment 1, for example. In terms of the configuration of communication terminal 2 according to the present embodiment, the conversion controller has a configuration different from that in Embodiment 1 or Embodiment 2, for example.

Figure 12:
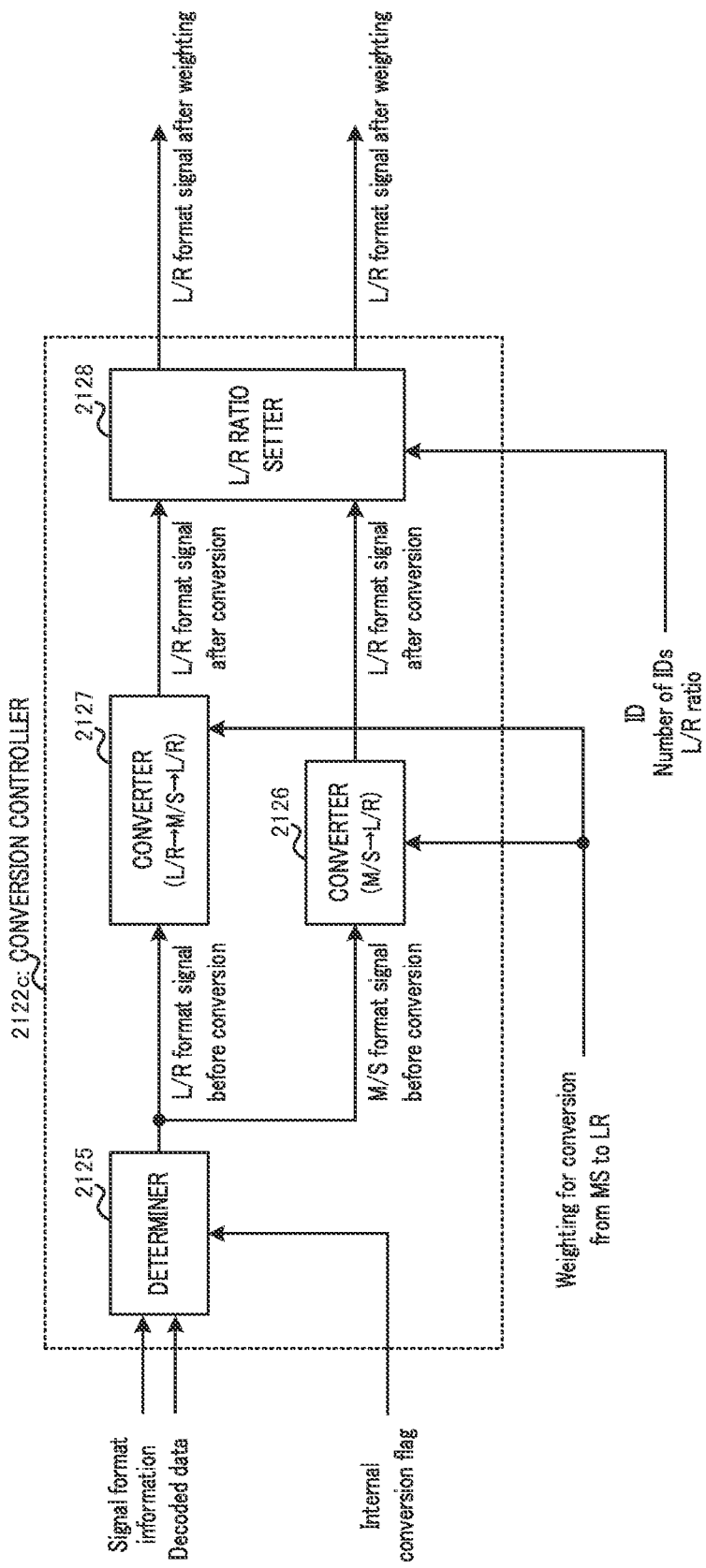
FIG. 12 is a block diagram illustrating an exemplary configuration of a conversion controller according to Embodiment 3.

FIG. 12 is a block diagram illustrating an exemplary configuration of conversion controller 2122c according to the present embodiment.

Conversion controller 2122c illustrated in FIG. 12 includes converter 2127 and L/R ratio setter 2128 in addition to the same configuration as that of conversion controller 2122, 2122a, 2122b, 31, or 41 in Embodiment 1 or Embodiment 2. For example, conversion controller 2122c may be included inside or outside codec 212.

For example, in conversion controller 2122c illustrated in FIG. 12, when determiner 2125 determines the signal format of the decoded data as the M/S format, converter 2126 converts the MS format signal into an L/R format signal. Then, converter 2126 outputs the converted UR format signal to L/R ratio setter 2128.

Meanwhile, w % ben determiner 2125 determines the signal format of the decoded data as the UR format, converter 2127 converts the UR format signal into an M/S format signal. Converter 2127 also converts the M/S format signal into an UR format signal. Then, converter 2127 outputs the converted UR format signal to UR ratio setter 2128.

Note that, when converting from the M/S format to the UR format in converter 2126 and converter 2127, for example, the ratio of the M signal may be set higher with respect to the S signal. In other words, for example, Expression 1 may be set with weighting factors $\alpha > \beta$. This setting emphasizes the M signal and reduces the spread of the sound of the UR format signal, thereby making it easier to adjust sound image localization (i.e., direction of the sound) by a setting of the ratio (UR ratio) between the L channel and R channel, which will be described later.

L/R ratio setter 2128 sets (or adjusts) the L/R ratio of the L/R format signal inputted from converter 2126 or converter 2127, for example. In other words, UR ratio setter 2128 may perform weighting to the L channel and R channel.

For example, L/R ratio setter 2128 may perform weighting to the L channel and R channel based on at least one of information to identify communication terminal 1 that is a transmission source of the UR format signal (e.g., ID), the number of communication terminals 1 that are transmission sources of the UR format signals (e.g., number of IDs), and the L/R ratio.

The setting of the UR ratio allows communication terminal 2 to, for example, configure the sound image localization (i.e., positions with respect to communication terminal 2) of source communication terminals 1 in any way or so as to have equal intervals. Further, as described above, the ratio of the M signal component to the S signal component is increased at the time of converting to the L/R format in converter 2126 and converter 2127 to reduce the sound spread. This makes it easier for communication terminal 2 to reproduce the sound as if the sound comes from the direction of the virtual position of each communication terminal 1 by setting the LR ratio.

By way of example, a description will be given of a case where the transmission system according to the present embodiment is applied to a multipoint conference system.

Figure 13:
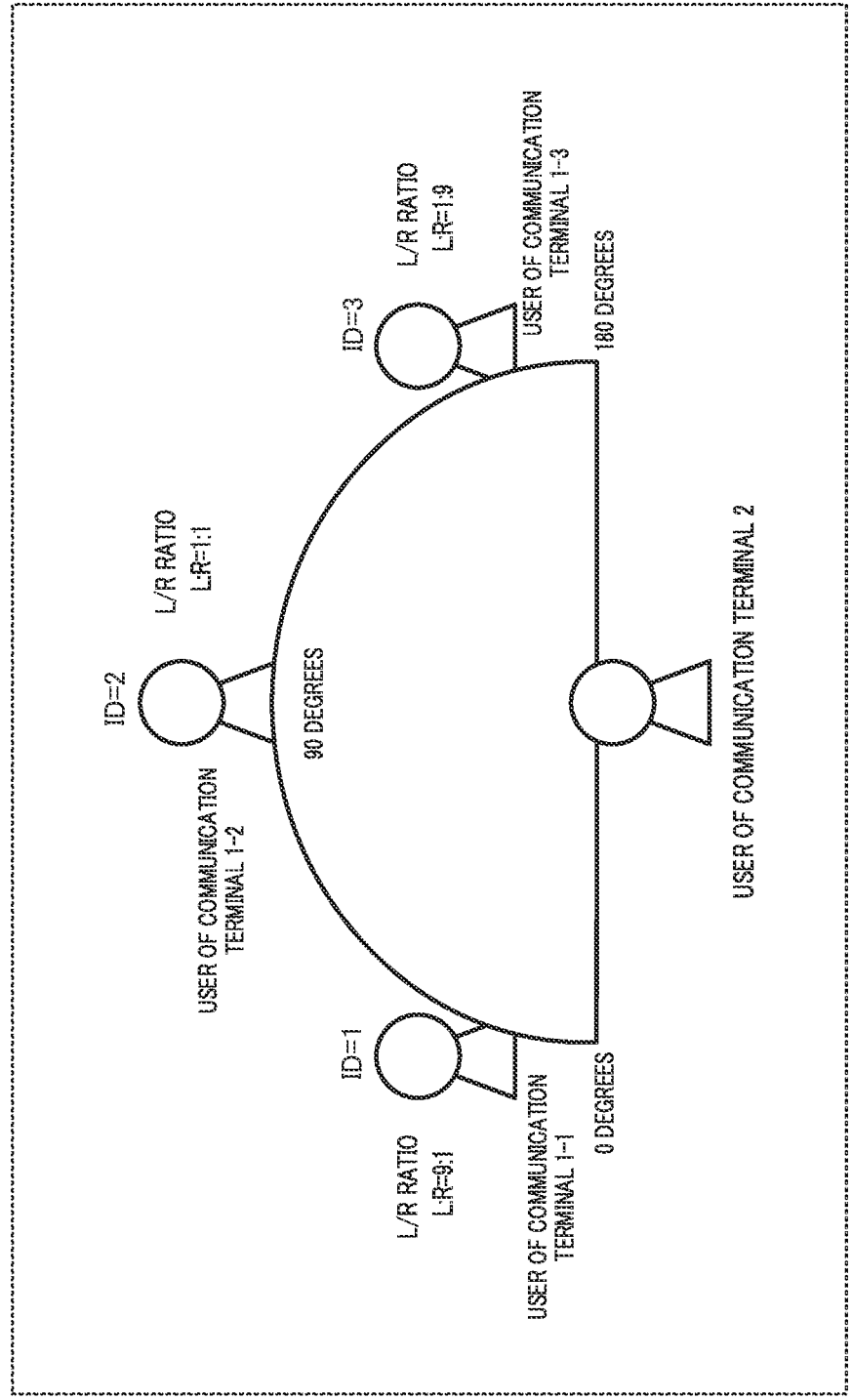
FIG. 13 illustrates an exemplary configuration of sound image localization according to Embodiment 3.

FIG. 13 illustrates exemplary sound image localization (i.e., virtual positions) of communication terminals 1 (or users) in the multipoint conference system. FIG. 13 illustrates an example where communication terminal 1-1, communication terminal 1-2, and communication terminal 1-3, which respectively correspond to three users, transmit encoded data of audio acoustic signals to communication terminal 2, for example. In FIG. 13, the ID of communication terminal 1-1 is set to 1, the ID of communication terminal 1-2 is set to 2, and the ID of communication terminal 1-3 is set to 3.

Communication terminal 2 adjusts the sense of sound image localization by setting the UR ratio of the UR format signal corresponding to the decoded data associated with each ID based on the ID of each communication terminal 1 and the number of IDs, for example.

For example, in FIG. 13, communication terminal 2 sets the UR ratio so that L:R=9:1 for communication terminal 1-1 with ID=1, sets the UR ratio so that L:R=1:1 for communication terminal 1-2 with ID=1, and sets the UR ratio so that L:R=1:9 for communication terminal 1-3 with ID=3. In other words, in FIG. 13, communication terminal 2 sets the sound image localization of communication terminal 1-1 to the direction around 0 degrees (i.e., to the left of communication terminal 2), sets the sound image localization of communication terminal 1-2 to the direction around 90 degrees (i.e., to the front of communication terminal 2), and sets the sound image localization of communication terminal 1-3 to the direction around 180 degrees (i.e., to the right of communication terminal 2).

The setting of the LR ratios illustrated in FIG. 13 causes communication terminal 2 to, for example, output the sound (e.g., voice) from communication terminal 1-1 as if it sounds from the position around 0 degrees, output the sound corresponding to communication terminal 1-2 as if it sounds from the position around 90 degrees, and output the sound corresponding to communication terminal 1-3 as if it sounds from the position around 180 degrees.

Note that the UR ratios illustrated in FIG. 13 are examples, and are not limited to these. In addition, the range of the sound image localization is not limited to the range from 0 degrees to 180 degrees, and may be another range such as a range including different directions, a wider range, or a narrower range.

Next, Method 5-1, Method 5-2, and Method 5-3 will be described as exemplary methods of setting the UR ratio. Note that the method of setting the UR ratio is not limited to these methods, and may be another method.

In Method 5-1, for example, the user interface application may output the UR ratio selected (or set) by a user to LR ratio setter 2128 (e.g., codec 212, voice communication application, or sound driver software) via the voice communication application.

In Method 5-2, for example, the voice communication application may set the number of IDs of communication terminals 1 communicating with communication terminal 2 to the number of communication terminals 1 to be placed, and calculate (or set) the UR ratio for each communication terminal 1 based on the set number of communication terminals 1.

In Method 5-3, for example, codec 212 may set the number of IDs of communication terminals 1 communicating with communication terminal 2 to the number of communication terminals 1 to be placed, and calculate (or set) the UR ratio for each communication terminal 1 based on the set number of communication terminals 1.

For example, when the number of IDs is three in Method 5-2 and Method 5-3, communication terminal 2 may set the UR ratios so that three communication terminals 1 are placed at equal intervals in the range from 0 degrees to 180 degrees as illustrated in FIG. 13. Note that the positions where communication terminals 1 are virtually placed are not limited to the positions at equal intervals in a certain range as illustrated in FIG. 13. For example, communication terminal 2 may configure the positions of communication terminals 1 in any positions in the range from 0 degrees to 180 degrees. Communication terminal 2 may also configure the positions of a plurality of communication terminals 1 so as to overlap with each other.

The methods of setting the UR ratio have been described, thus far.

The ID may be, for example, information that can identify a communication counterpart or speaker, such as an Internet Protocol (IP) address, a Medium Access Control (MAC) address, or a user ID. The ID may be associated with decoded data, for example. In addition, the ID may be transmitted from communication terminal 1 to communication terminal 2, for example. Method 6-1 and Method 6-2 will be described as exemplary methods of transmitting the ID. Note that the method of transmitting the ID is not limited to these methods, and may be another method.

In Method 6-1, for example, communication terminal 1 may encode the ID together with encoded data in encoder 1222, and transmit a transmission bit stream including the ID.

In Method 6-2, for example, when communication terminal 1 encodes encoded data in encoder 1222 and transmits a transmission bit stream to communication terminal 2 by the communication driver software, the ID may be added to the header of the communication protocol and transmitted.

For example, during the session negotiation, communication terminal 2 may count the number of IDs of communication terminals 1 to communicate with, and acquire the number of IDs. Further, when there is a user who establishes a communication session during communication (e.g., call) or when there is a user who terminates the communication session during communication, for example, communication terminal 2 may update (e.g., increase or decrease) the number of IDs via the communication driver software.

As described above, in the present embodiment, communication terminal 2 performs the conversion control of decoded data based on the signal format of a signal encoded in communication terminal 1, and adjusts the UR ratio of an LR format signal. The adjustment of the UR ratio allows communication terminal 2 to adjust the sound image localization of communication terminal 1 to an appropriate position.

Further, when the signal format of a signal encoded in communication terminal 1 is the M/S format, for example, communication terminal 2 performs weighting for emphasizing the M signal when converting from the M/S format to the L/R format. This weighting reduces the sound spread of the L/R format signal before the L/R ratio setting, thereby improving adjustment accuracy of the sound image localization of communication terminal 1 by setting the UR ratio.

Note that, with reference to FIG. 12, a description has been given of the case of setting the ratio of an M signal component higher with respect to an S signal (e.g., setting weighting factors α>β for the conversion from the MIS format to the UR format in converter 2126 and converter 2127, by way of example. The setting is not limited to this, however, and the weighting is not necessarily performed. Even in this case, the sound image localization of each communication terminal can be configured by changing the ratio of the L channel signal and R channel signal by L/R ratio setter 2128.

For example, in a case of communication terminal 2 that is not capable of converting from the M/S format to the UR format, the UR ratio may be set for the UR format signal transmitted from communication terminal 1.

Note that, although the present embodiment is applied to a multipoint conference system as an example, the present embodiment is not limited to this, and may be applied to, for example, a multipoint recording system. A music studio recording system may be considered as an exemplary multipoint recording system. In the music studio recording system, communication terminal 2 (communication terminal on the reception side) can reproduce a virtual studio environment by appropriately configuring the sound image localization (position) of an audio acoustic signal (e.g., instrumental or vocal sound) transmitted from each point (i.e., each communication terminal 1), for example, in the same manner as in the present embodiment.

In the present embodiment, communication terminal 2 places (e.g., sets the sound image localization of) communication terminals 1 at all the points negotiated in the session based on the IDs, by way of example, but the present disclosure is not limited to this. For example, communication terminal 2 may place (e.g., set the sound image localization of) sounds transmitted from communication terminals 1 at some points among communication terminals 1 at the plurality of points negotiated in the session.

For example, the more the number of points corresponding to communication terminals 1 is (e.g., 10 points), the closer the sound image positions are even when communication terminals 1 at all points are placed at equal intervals or in any way. This makes it more difficult for a user to accurately perceive the sound image position of the 10 points as intended. With this regard, communication terminal 2 may, for example, configure representative points (e.g., three positions of the left side, right side, and front side of communication terminal 2) of the placement positions to place the sound image positions, and output, from the representative point, the sound transmitted from communication terminal 1 at a point where the sound actually comes from among the plurality of communication terminals 1 (e.g., at 10 points).

In this case, when the point where the sound comes from is changed, for example, communication terminal 2 may change the point at which the representative point is placed. For example, a user of communication terminal 1 at point A is speaking (making a sound) and the sound image position of point A is placed on the left side of communication terminal 2. In such a situation, when the user at point A finishes speaking and a user of communication terminal 1 at point B starts speaking, communication terminal 2 may change the output from the sound image position placed on the left side of communication terminal 2 from the sound at point A to the sound at point B.

In the present embodiment, the sound image is localized to a position different for each ID, by way of example, but the present disclosure is not limited to this. For example, communication terminal 2 may provide a silent area between the sound image localization position of a certain ID and the sound image localization position of another adjacent ID. Setting the silent area allows a user to more clearly distinguish the adjacent sound images.

Embodiment 4

In each of Embodiments 1 to 3, a function relating to the conversion control of the signal format (e.g., conversion controller 1222) is provided inside a codec in a communication terminal on the transmission side, as illustrated in FIG. 1, for example. In the present embodiment, in contrast, the function relating to the conversion control of the signal format is provided outside the codec in the communication terminal on the transmission side.

Note that the configuration of a communication terminal on the reception side according to the present embodiment may be the same as any of the configurations in Embodiments 1 to 3, for example.

Figure 14:
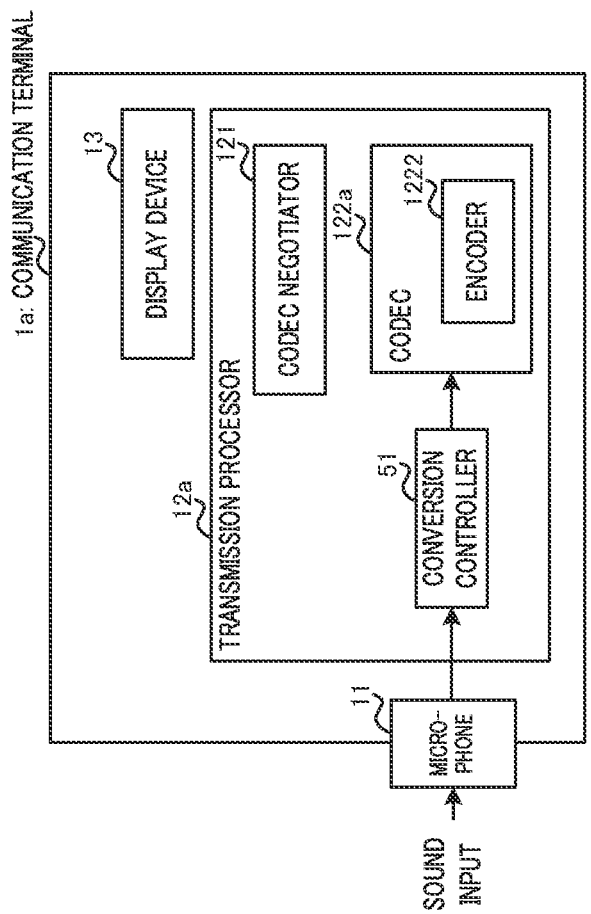
FIG. 14 is a block diagram illustrating an exemplary configuration of a communication terminal according to Embodiment 4.

FIG. 14 is a block diagram illustrating an exemplary configuration of communication terminal 1a according to the present embodiment.

Transmission processor 12a of communication terminal 1a illustrated in FIG. 14 includes conversion controller 51 outside codec 122a. Codec 122a does not have a function of performing the conversion control of the signal format. In other words, encoder 1222 among conversion controller 51 and encoder 1222 may be included in codec 122a in communication terminal 1a.

Conversion controller 51 may be included in, for example, at least one of the voice communication application and sound driver software. Note that the operation of conversion controller 51 is the same as that of conversion controller 1221 in Embodiment 1, for example.

Figure 15:
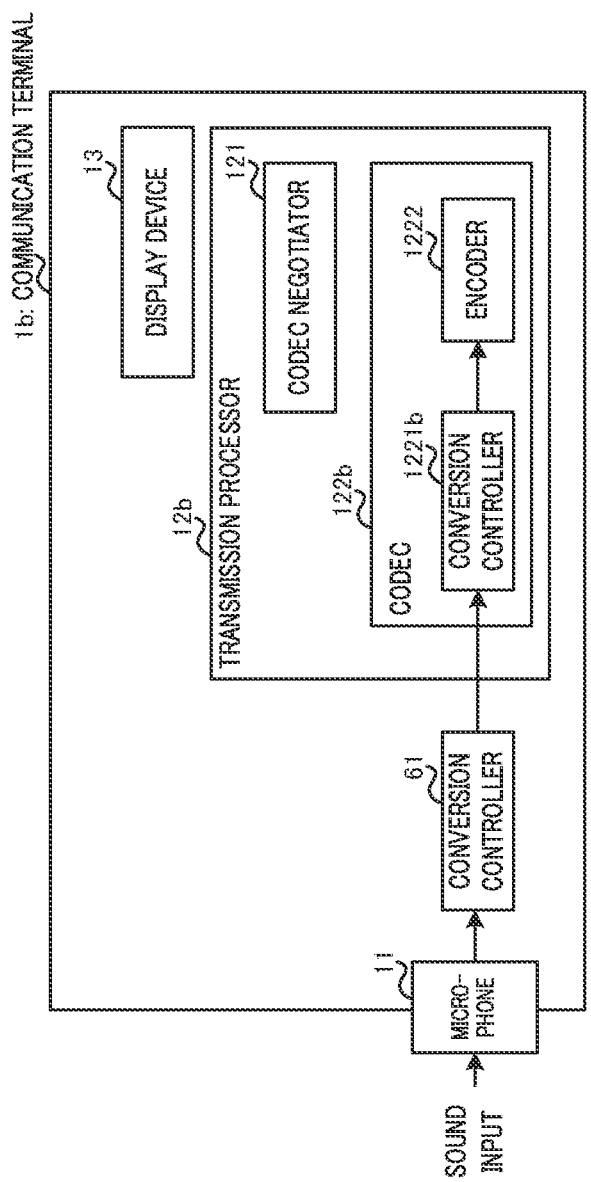
FIG. 15 is a block diagram illustrating an exemplary configuration of a communication terminal according to Embodiment 4.

FIG. 15 is a block diagram illustrating another exemplary configuration of communication terminal 1b according to the present embodiment.

Transmission processor 12b of communication terminal 1b illustrated in FIG. 15 includes conversion controller 1221b inside codec 122b and conversion controller 61 outside codec 122b. Conversion controller 61 may be included in, for example, at least one of the voice communication application and sound driver software. Note that the operations of conversion controller 1221b and conversion controller 61 for the conversion control are, for example, the same as that of conversion controller 1221 in Embodiment 1.

For example, communication terminal 1b may perform the conversion control, such as the determination and conversion of the signal format, in one of conversion controller 1221b and conversion controller 61. For example, communication terminal 1b may operate based on the "internal conversion flag" indicating whether the conversion control is to be performed in conversion controller 1221b or conversion controller 61. A value of the internal conversion flag may be, for example, a value indicating that the conversion control is performed inside codec 122b (e.g., value: internally enabled) or a value indicating that the conversion control is performed outside codec 122b (e.g., value: internally disabled).

For example, in a case where an existing codec (e.g., EVS) is configured in communication terminal 2, communication terminal 2 has no conversion control function outside codec 212, and an existing codec (e.g., EVS) is configured in communication terminal 1, the value of the internal conversion flag may be set to "internally disabled" and conversion controller 61 may convert an M/S format signal to an L/R format signal.

Note that which of conversion controller 1221b and conversion controller 61 performs the conversion control (in other words, the setting of the internal conversion flag) may be set in any way by a system design or user's selection, for example.

As described above, the present embodiment enables appropriate stereo encoding in accordance with a stereo microphone as in Embodiment 1 even when the conversion control of the signal format is performed in either inside or outside the codec in the communication terminal on the transmission side.

Embodiment 5

In the present embodiment, a description will be given of a method for a communication terminal on the reception side to control weighting at the time of the conversion from the M/S format to the L/R format based on information on the type of an output device (also referred to as an output destination device).

Figure 16:
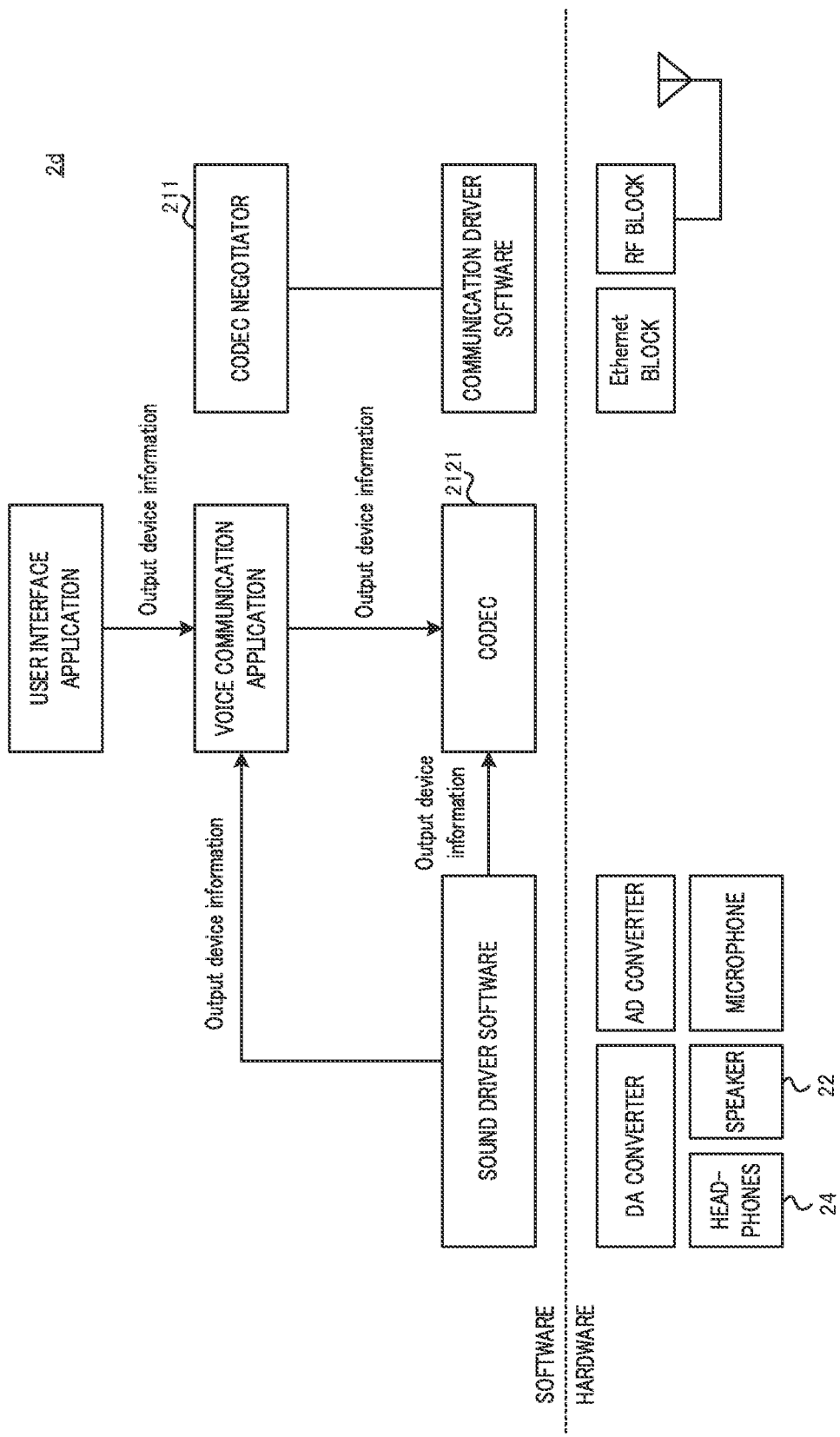
FIG. 16 illustrates exemplary configurations of software and hardware of a communication terminal according to Embodiment 5.

FIG. 16 illustrates exemplary configurations of software and hardware of communication terminal 2d according to the present embodiment.

Note that the configuration of communication terminal 2d on the reception side may be the same as the configuration of communication terminal 2 (FIG. 1), communication terminal 2a (FIG. 7), or communication terminal 2b (FIG. 8), for example. In addition, the configuration of a communication terminal on the transmission side may be the same as the configuration of communication terminal 1 (FIG. 1), communication terminal 1a (FIG. 14), or communication terminal 1b (FIG. 15), for example.

In FIG. 16, the output device in communication terminal 2d is either speaker 22 and headphones 24, by way of example. Note that at least one of speaker 22 and headphones 24 may be a device built in communication terminal 2d, or may be an external device connected to communication terminal 2d.

For example, communication terminal 2d (e.g., sound driver software) detects the switching of the output devices, and determines the weighting (e.g., weightings α and β) for the conversion from the M/S format to the L/R format based on output device information indicating the switched output device (e.g., either speaker 22 or headphone 24). Note that the conversion of the signal format in communication terminal 2d may be performed following Expression 1, for example, as in Embodiment 1.

For example, communication terminal 2d respectively sets weighting factors α and β to a1 and b1 when headphones 24 are configured as the output device, and respectively sets weighting factors α and β to a2 and b2 when speaker 22 is configured as the output device. When the output device is switched from headphone 24 to speaker 22, for example, communication terminal 2d updates weighting factor α from a1 to a2 and weighting factor β from b1 to b2. Likewise, when the output device is switched from speaker 22 to headphone 24, for example, communication terminal 2d updates weighting factor α from a2 and b2 to a1 and b1.

For example, weighting factors α and β may be set such that a1<b1 and a2>b2. This condition increases the sound spread for headphones 24 and reduces the sound spread for the speaker. Note that the values of weighting factors α and β may be set in any way, for example, by a system design or user's selection (in other words, depending on the needs of a user).

Next, Method 7-1, Method 7-2, and Method 7-3 will be described as exemplary methods of inputting the output device information to codec 212. Note that the method of inputting the output device information is not limited to these methods, and may be another method.

In Method 7-1, for example, the voice communication application may acquire the output device information (i.e., information on the switching of output devices) from the sound driver software, and output the information to codec 212.

In Method 7-2, for example, codec 212 may acquire the output device information from the sound driver software.

In Method 7-3, for example, the user interface application may output the output device information indicating the output device selected by a user to codec 212 via the voice communication application. In Method 7-3, for example, display device 23 (e.g., liquid crystal display) of communication terminal 2 may display a screen for selecting the use of headphones 24 or the use of speaker 22. The user interface application may configure the output device information indicating the output device selected by a user.

As described above, the present embodiment allows communication terminal 2d to adjust the sense of the sound spread of an UR format signal depending on the type of the output device.

The embodiments of the present disclosure have been described, thus far.

OTHER EMBODIMENTS

1. Information indicating the type of a microphone (hereinafter "microphone type information") may be signaled (see, for example, PTL 3). In addition, the type of a microphone may also be used in a session negotiation as a characteristic parameter of a communication terminal on the transmission side, which is also referred to as a transmitter or transmission terminal, or a communication terminal on the reception side, which is also referred to as a receiver or reception terminal (see, for example, PTL 4).

For example, in the embodiments described above, the signal format information is transmitted from communication terminal 1 (communication terminal on the transmission side) to communication terminal 2 (communication terminal on the reception side), but the present disclosure is not limited to this. For example, communication terminal 1 may transmit (i.e., signal, or transmit as a characteristic parameter) the microphone type information to communication terminal 2, and communication terminal 2 may determine the signal format of encoded data (or decoded data) based on the microphone type information and the output conversion capability in the same manner as communication terminal 1.

2. The conversion expression for the conversion from the M/S format to the L/R format is not limited to Expression 1. For example, as indicated in Expression 2 and Expression 3, one of the weighting factors (e.g., δ) for the M signal (M) and the S signal (S) may be set to a fixed value, and the other one of the weighting factors (e.g., β and γ) may be variably set for each of the L channel signal (L) and the R channel signal (R).

$$L=\beta M+\delta S \quad [2]$$

$$R=\gamma M-\delta S \quad \text{(Expression 2)}$$

$$L=\delta M+\beta S \quad [3]$$

$$R=\delta M-\gamma S \quad \text{(Expression 3)}$$

Note that β and γ may be any values, and δ is a constant in Expressions 2 and 3.

Alternatively, as indicated in Expression 4, the weighting factors for the M signal (M) and the S signal (S) may be variably set in each of the L channel signal (L) and the R channel signal (R).

$$L=\beta M+\varepsilon S \quad [4]$$

$$R=\gamma M-\zeta S \quad \text{(Expression 4)}$$

Note that β, γ, ε, and ζ may be any values in Expression 4.

3. In the embodiments described above, the signal format conversion is applied to an MIS format input signal acquired by an M-S microphone, but the signal format conversion target is not limited to the M/S format signal.

The format conversion processing may be performed in the same manner as in the above embodiments, for example, on a signal in a format including two channel signals that are not suitable to be outputted from two speakers (including headphones) as they are (i.e., without conversion).

The following signals may be examples of a signal in the format that is not suitable to be outputted from two speakers as it is.

For example, as in the case of the M-S microphone, the example may be a signal in which one of the two channels is an M signal (e.g., mono component composed of a sum signal of the two channels) and the other is an S signal (e.g., reverberation component composed of a difference signal of the two channels). When a user hears the two channels composing such signals as stereo (i.e., L channel and R channel) at the same time, a monophonic sound comes from a speaker corresponding to one channel, and a noisy sound of the reverberation component comes from a speaker corresponding to the other channel. This is possibly very unpleasant for the user.

As described above, the signal in the format that is not suitable to be outputted from two speakers as it is includes a signal one channel of which is perceived as noise when a user hears as stereo.

Further, a stereo microphone that supports the same band possibly has a large energy difference (e.g., energy difference greater than or equal to a threshold) in the frequency band between two channels such that one of the two channels has a large amount of high-frequency components and the other has a large amount of low-frequency components. When a user hears these two channels as stereo at the same time, a sound specific to the high frequency (e.g., high-pitched noise) comes from a speaker corresponding to one channel, and a sound specific to the low frequency comes from a speaker corresponding to the other channel. This is possibly very unpleasant for the user.

As described above, the signal in the format that is not suitable to be outputted from two speakers as it is includes a signal the outputted frequencies of which are unbalanced when heard as stereo and makes a user uncomfortable.

There may also be a stereo microphone, for example, composed of microphones supporting different bandwidths between two channels such that one channel has a characteristic of the SuperWideBand (SWB, 0 to 32 kHz), and the other channel has a characteristic of the NarrowBand (NB, 0 to 8 kHz). A signal acquired by such a stereo microphone causes, for example, the same situation as in the case where one of the two channels has a large amount of high-frequency components and the other has a large amount of low-frequency components.

Note that the bandwidth is not limited to the SWB and NB, and may be another bandwidth such as the FullBand (FB, 0 to 48 kHz) or WideBand (WB, 0 to 32 kHz). Further, the bandwidth such as the SWB, NB, FB, or WB is merely an example, and a bandwidth divided at any bandwidth (e.g., bandwidth such as 0 to 4 kHz, 12 to 24 kHz, or 32 to 48 kHz) may be included.

Incidentally, the expression "to support a bandwidth" used above may be replaced with, for example, an expression indicating a bandwidth from a different perspective such as "to emphasize a bandwidth".

Other embodiments have been described, thus far.

Although various embodiments have been described above with reference to the drawings, it goes without saying that the present disclosure is not limited to foregoing embodiments. Further, any components in the embodiments described above may be combined as appropriate.

In the embodiments described above, " . . . er (or)" used for each component may be replaced with another term such as " . . . circuit (circuitry)", " . . . device", " . . . unit" and " . . . module".

The present disclosure can be realized by software, hardware, or software in cooperation with hardware. Each functional block used in the description of each embodiment described above can be partly or entirely realized by an LSI such as an integrated circuit, and each process described in the each embodiment may be controlled partly or entirely by the same LSI or a combination of LSIs. The LSI may be individually formed as chips, or one chip may be formed so as to include a part or all of the functional blocks. The LSI may include a data input and output coupled thereto. The LSI here may be referred to as an IC, a system LSI, a super LSI, or an ultra LSI depending on a difference in the degree of integration.

The technique of implementing an integrated circuit is not limited to the LSI and may be realized by using a dedicated circuit, a general-purpose processor, or a special-purpose processor. In addition, a FPGA (Field Programmable Gate Array) that can be programmed after the manufacture of the LSI or a reconfigurable processor in which the connections and the settings of circuit cells disposed inside the LSI can be reconfigured may be used. The present disclosure can be realized as digital processing or analogue processing.

Further, if future integrated circuit technology replaces LSIs as a result of the advancement of semiconductor technology or other derivative technology, the functional blocks could be integrated using the future integrated circuit technology. Biotechnology can also be applied.

The present disclosure can be realized by any kind of apparatus, device or system having a function of communication, which is referred to as a communication apparatus. The communication apparatus may comprise a transceiver and processing/control circuitry. The transceiver may comprise and/or function as a receiver and a transmitter. The transceiver, as the transmitter and receiver, may include an RF (radio frequency) module including amplifiers, RF modulators/demodulators and the like, and one or more antennas. Some non-limiting examples of such a communication apparatus include a phone (e.g, cellular (cell) phone, smart phone), a tablet, a personal computer (PC) (e.g, laptop, desktop, netbook), a camera (e.g, digital still/video camera), a digital player (digital audio/video player), a wearable device (e.g, wearable camera, smart watch, tracking device), a game console, a digital book reader, a telehealth/telemedicine (remote health and medicine) device, and a vehicle providing communication functionality (e.g., automotive, airplane, ship), and various combinations thereof.

The communication apparatus is not limited to be portable or movable, and may also include any kind of apparatus, device or system being non-portable or stationary, such as a smart home device (e.g, an appliance, lighting, smart meter, control panel), a vending machine, and any other "things" in a network of an "Internet of Things (loT)".

The communication may include exchanging data through, for example, a cellular system, a wireless LAN system, a satellite system, etc., and various combinations thereof.

The communication apparatus may comprise a device such as a controller or a sensor which is coupled to a communication device performing a function of communication described in the present disclosure. For example, the communication apparatus may comprise a controller or a sensor that generates control signals or data signals which are used by a communication device performing a communication function of the communication apparatus.

The communication apparatus also may include an infrastructure facility, such as a base station, an access point, and any other apparatus, device or system that communicates with or controls apparatuses such as those in the above non-limiting examples.

An encoding apparatus according to an embodiment of the present disclosure includes: control circuitry, which, in operation, performs control for conversion of a signal format of a sound signal based on information on a conversion capability of a decoding apparatus that decodes encoded data of the sound signal, the conversion capability being a capability for converting the signal format of the sound signal; and encoding circuitry, which, in operation, encodes the sound signal following the control for the conversion.

In an embodiment of the present disclosure, when the information on the conversion capability indicates that conversion to a first signal format is not supported, the control circuitry converts the sound signal that is in a second signal format and inputted to the encoding apparatus into the first signal format.

In an embodiment of the present disclosure, the first signal format is a format represented by a left channel signal and a right channel signal that compose the sound signal, and the second signal format is a format represented by a sum signal indicating a sum of the left channel signal and the right channel signal and a difference signal indicating a difference between the left channel signal and the right channel signal.

In an embodiment of the present disclosure, the control circuitry does not apply the conversion when the sound signal that is in the first signal format is inputted to the encoding apparatus.

In an embodiment of the present disclosure, the control circuitry performs weighting to the sum signal and the difference signal in converting the second signal format into the first signal format.

In an embodiment of the present disclosure, reception circuitry, which, in operation, receives the information on the conversion capability in session negotiation for communication between the encoding apparatus and the decoding apparatus is further included.

In an embodiment of the present disclosure, both the control circuitry and the encoding circuitry are included in a codec, or the encoding circuitry among the control circuitry and the encoding circuitry is included in the codec.

A decoding apparatus according to an embodiment of the present disclosure is a decoding apparatus that decodes encoded data of a sound signal, and includes: decoding circuitry, which, in operation, decodes the encoded data encoded in an encoding apparatus, the encoded data being encoded based on information on a conversion capability of the decoding apparatus, the conversion capability being a capability for converting a signal format of the sound signal; and control circuitry, which, in operation, controls conversion of the signal format.

In an embodiment of the present disclosure, when the information on the conversion capability indicates that conversion to a first signal format is supported, the control circuitry converts the encoded data of the sound signal into the first signal format, the encoded data being in a second signal format and inputted to the decoding apparatus.

In an embodiment of the present disclosure, the first signal format is a format represented by a left channel signal and a right channel signal that compose the sound signal, and the second signal format is a format represented by a sum signal indicating a sum of the left channel signal and the right channel signal and a difference signal indicating a difference between the left channel signal and the right channel signal.

In an embodiment of the present disclosure, the control circuitry performs weighting to the sum signal and the difference signal in converting the second signal format into the first signal format.

In an embodiment of the present disclosure, the control circuitry controls the weighting based on information on a type of an output destination device of decoded data acquired in the decoding circuitry.

In an embodiment of the present disclosure, the control circuitry adjusts a ratio between the left channel signal and the right channel signal that compose decoded data acquired in the decoding circuitry.

In an embodiment of the present disclosure, both the decoding circuitry and the control circuitry are included in a codec, or the decoding circuitry among the decoding circuitry and the control circuitry is included in the codec.

An encoding method according to an embodiment of the present disclosure includes: performing, by an encoding apparatus, control for conversion of a signal format of a sound signal based on information on a conversion capability of a decoding apparatus that decodes encoded data of the sound signal, the conversion capability being a capability for converting the signal format of the sound signal; and encoding, by the encoding apparatus, the sound signal following the control for the conversion.

A decoding method according to an embodiment of the present disclosure includes: decoding, by a decoding apparatus that decodes encoded data of a sound signal, the encoded data encoded in an encoding apparatus, the encoded data being encoded based on information on a conversion capability of the decoding apparatus, the conversion capability being a capability for converting a signal format of the sound signal; and controlling, by the decoding apparatus, conversion of the signal format.

The disclosure of Japanese Patent Application No. 2020-001961, filed on Jan. 9, 2020, including the specification, drawings and abstract, is incorporated herein by reference in its entirety.

INDUSTRIAL APPLICABILITY

An exemplary embodiment of the present disclosure is useful for transmission systems for audio acoustic signals.

REFERENCE SIGNS LIST 1, 1a, 1b, 2, 2a, 2b Communication terminal
11 Microphone
12, 12a, 12b Transmission processor
13, 23 Display device
21, 21a, 21b Reception processor
22 Speaker
121, 211 Codec negotiator
122, 122a, 122b, 212, 212a, 212b Codec
1221, 1221b, 2122, 2122b, 31, 41, 51, 61 Conversion controller
1222 Encoder
1225, 2125 Determiner
1226, 2126, 2127 Converter
2121 Decoder
2128 L/R ratio setter

The invention claimed is:

1. An encoding apparatus, comprising:
control circuitry, which, in operation, performs control for conversion of a signal format of a sound signal based on information on a conversion capability of a decoding apparatus that decodes encoded data of the sound signal, the conversion capability being a capability for converting the signal format of the sound signal; and encoding circuitry, which, in operation, encodes the sound signal following the control for the conversion, wherein when the information on the conversion capability indicates that conversion to a first signal format is not supported, the control circuitry converts the sound signal that is in a second signal format and inputted to the encoding apparatus into the first signal format, the first signal format is a format represented by a left channel signal and a right channel signal that compose the sound signal, and the second signal format is a format represented by a sum signal indicating a sum of the left channel signal and the right channel signal and a difference signal indicating a difference between the left channel signal and the right channel signal.

2. The encoding apparatus according to claim 1, wherein the control circuitry does not apply the conversion when the sound signal that is in the first signal format is inputted to the encoding apparatus.

3. The encoding apparatus according to claim 1, wherein the control circuitry performs weighting to the sum signal and the difference signal in converting the second signal format into the first signal format.

4. The encoding apparatus according to claim 1, further comprising reception circuitry, which, in operation, receives the information on the conversion capability in session negotiation for communication between the encoding apparatus and the decoding apparatus.

5. The encoding apparatus according to claim 1, wherein both the control circuitry and the encoding circuitry are included in a codec, or the encoding circuitry among the control circuitry and the encoding circuitry is included in the codec.

6. A decoding apparatus that decodes encoded data of a sound signal, the decoding apparatus comprising:

decoding circuitry, which, in operation, decodes the encoded data encoded in an encoding apparatus, the encoded data being encoded based on information on a conversion capability of the decoding apparatus, the conversion capability being a capability for converting a signal format of the sound signal; and control circuitry, which, in operation, controls conversion of the signal format, wherein when the information on the conversion capability indicates that conversion to a first signal format is supported, the control circuitry converts the encoded data of the sound signal into the first signal format, the encoded data being in a second signal format and inputted to the decoding apparatus, the first signal format is a format represented by a left channel signal and a right channel signal that compose the sound signal, and the second signal format is a format represented by a sum signal indicating a sum of the left channel signal and the right channel signal and a difference signal indicating a difference between the left channel signal and the right channel signal.

7. The decoding apparatus according to claim 6, wherein the control circuitry performs weighting to the sum signal and the difference signal in converting the second signal format into the first signal format.

8. The decoding apparatus according to claim 7, wherein the control circuitry adjusts a ratio between the left channel signal and the right channel signal that compose decoded data acquired in the decoding circuitry.

9. The decoding apparatus according to claim 6, wherein the control circuitry controls the weighting based on information on a type of an output destination device of decoded data acquired in the decoding circuitry.

10. The decoding apparatus according to claim 6, wherein both the decoding circuitry and the control circuitry are included in a codec, or the decoding circuitry among the decoding circuitry and the control circuitry is included in the codec.

11. An encoding method, comprising:

performing, by an encoding apparatus, control for conversion of a signal format of a sound signal based on information on a conversion capability of a decoding apparatus that decodes encoded data of the sound signal, the conversion capability being a capability for converting the signal format of the sound signal; and encoding, by the encoding apparatus, the sound signal following the control for the conversion, wherein when the information on the conversion capability indicates that conversion to a first signal format is not supported, the sound signal that is in a second signal format and inputted to the encoding apparatus is converted into the first signal format, the first signal format is a format represented by a left channel signal and a right channel signal that compose the sound signal, and the second signal format is a format represented by a sum signal indicating a sum of the left channel signal and the right channel signal and a difference signal indicating a difference between the left channel signal and the right channel signal.

12. A decoding method, comprising:

decoding, by a decoding apparatus that decodes encoded data of a sound signal, the encoded data encoded in an encoding apparatus, the encoded data being encoded based on information on a conversion capability of the decoding apparatus, the conversion capability being a capability for converting a signal format of the sound signal; and controlling, by the decoding apparatus, conversion of the signal format, wherein when the information on the conversion capability indicates that conversion to a first signal format is supported, the encoded data of the sound signal is converted into the first signal format, the encoded data being in a second signal format and inputted to the decoding apparatus, the first signal format is a format represented by a left channel signal and a right channel signal that compose the sound signal, and the second signal format is a format represented by a sum signal indicating a sum of the left channel signal and the right channel signal and a difference signal indicating a difference between the left channel signal and the right channel signal.

* * * * *